(12) United States Patent  
Shibata

(10) Patent No.: US 7,663,174 B2
(45) Date of Patent: Feb. 16, 2010

(54) SEMICONDUCTOR DEVICE AND METHOD FOR MANUFACTURING THE SAME

(76) Inventor: Yoshiyuki Shibata, 4-15-6, Sakamoto, Otsu-shi, Shiga 520-0113 (JP)

( * ) Notice: Subject to any disclaimer, the term of this patent is extended or adjusted under 35 U.S.C. 154(b) by 164 days.

(21) Appl. No.: 12/076,990

(22) Filed: Mar. 26, 2008

(65) Prior Publication Data

US 2008/0180986 A1    Jul. 31, 2008

Related U.S. Application Data

(62) Division of application No. 11/189,896, filed on Jul. 27, 2005, now abandoned, which is a division of application No. 10/694,891, filed on Oct. 29, 2003, now Pat. No. 6,956,261.

(30) Foreign Application Priority Data

Jan. 31, 2003    (JP) ............................. 2003-023542

(51) Int. Cl.
  *H01L 27/108*    (2006.01)
  *H01L 29/94*    (2006.01)
(52) U.S. Cl. ............................. 257/306; 257/E27.084; 257/E21.646; 257/906
(58) Field of Classification Search ......... 257/301–310, 257/500, 906, E27.084, E21.646
  See application file for complete search history.

(56) References Cited

U.S. PATENT DOCUMENTS 4,825,268 A    4/1989    Oowaki

| 5,138,412 | A | 8/1992 | Hieda et al. |
| 5,696,014 | A | 12/1997 | Figura |
| 5,814,547 | A | 9/1998 | Chang |
| 5,858,832 | A | 1/1999 | Pan |
| 6,300,647 | B1 | 10/2001 | Hamada et al. |
| 6,313,497 | B1 | 11/2001 | Iwasa |
| 6,380,102 | B1 | 4/2002 | Oh |
| 6,418,044 | B1 | 7/2002 | Laurent |
| 6,677,650 | B2 | 1/2004 | Fischer et al. |
| 6,731,529 | B2 | 5/2004 | Jacob et al. |
| 6,858,513 | B2 | 2/2005 | Fujisawa |
| 2001/0013619 | A1 * | 8/2001 | Parekh et al. ............... 257/306 |
| 2003/0184953 | A1 | 10/2003 | Lee et al. |

FOREIGN PATENT DOCUMENTS

| JP | 2000-223589 A | 8/2000 |
| JP | 2000-232076 A | 8/2000 |

OTHER PUBLICATIONS

Japanese Office Action issued in corresponding Japanese Patent Application No. JP 2003-023542, dated Nov. 14, 2006.

* cited by examiner

*Primary Examiner*—Leonardo Andújar
*Assistant Examiner*—Monica D Harrison
(74) *Attorney, Agent, or Firm*—McDermott Will & Emery LLP

(57) ABSTRACT

A first DRAM section including a first memory cell having a first capacitance and a second DRAM section including a second memory cell having a second capacitance different from the first capacitance are provided on the same semiconductor substrate.

7 Claims, 12 Drawing Sheets

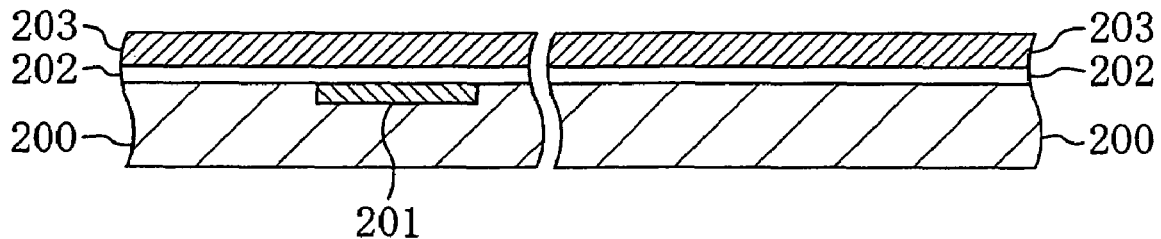
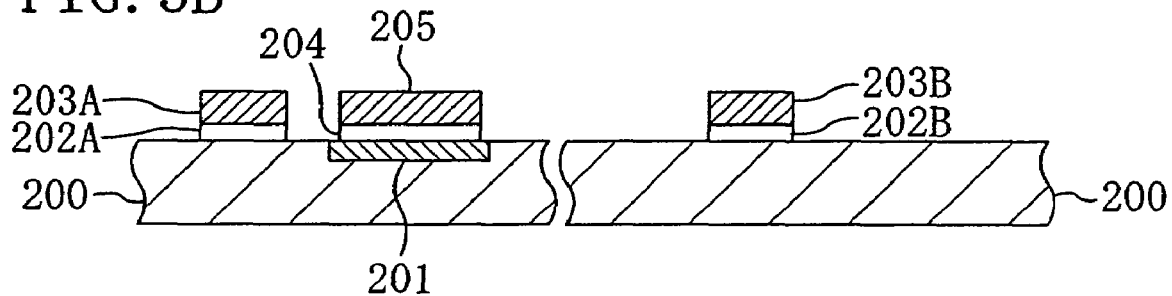
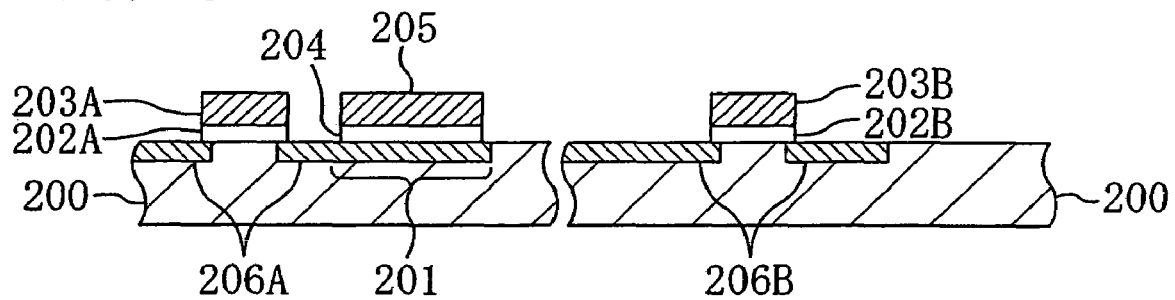
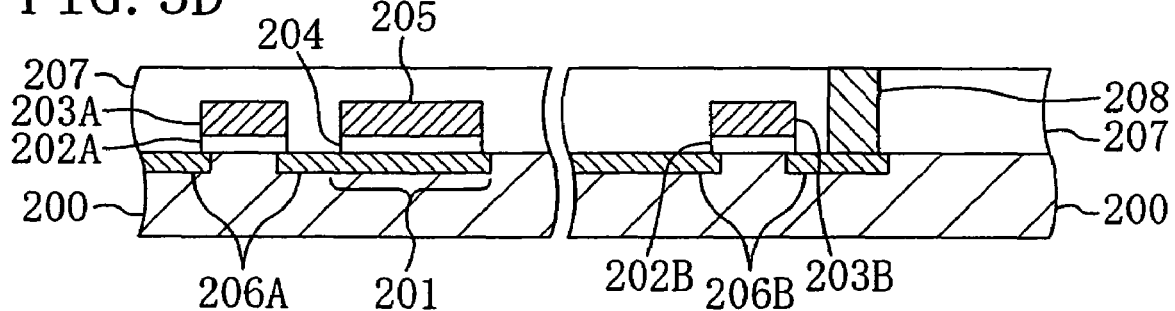

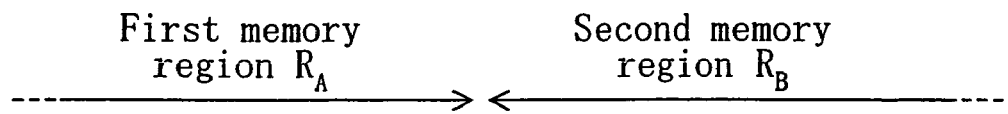
FIG. 4A
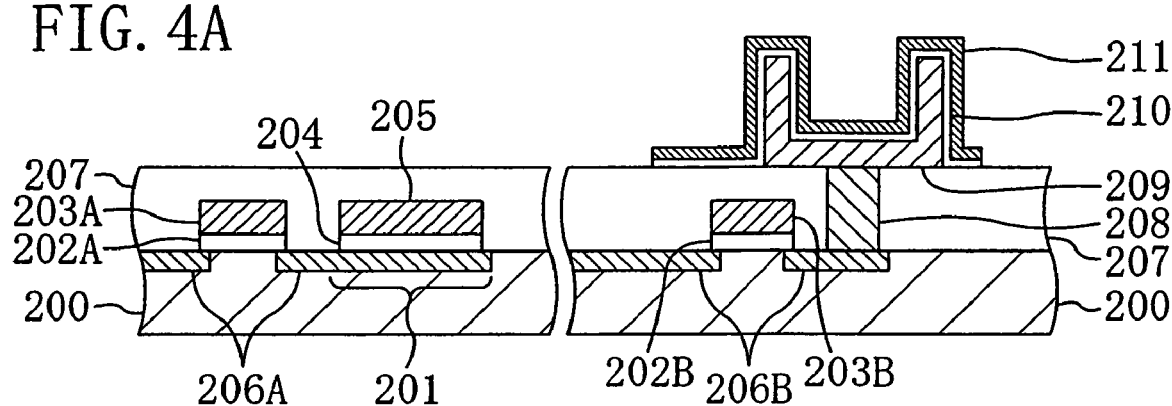
FIG. 4B
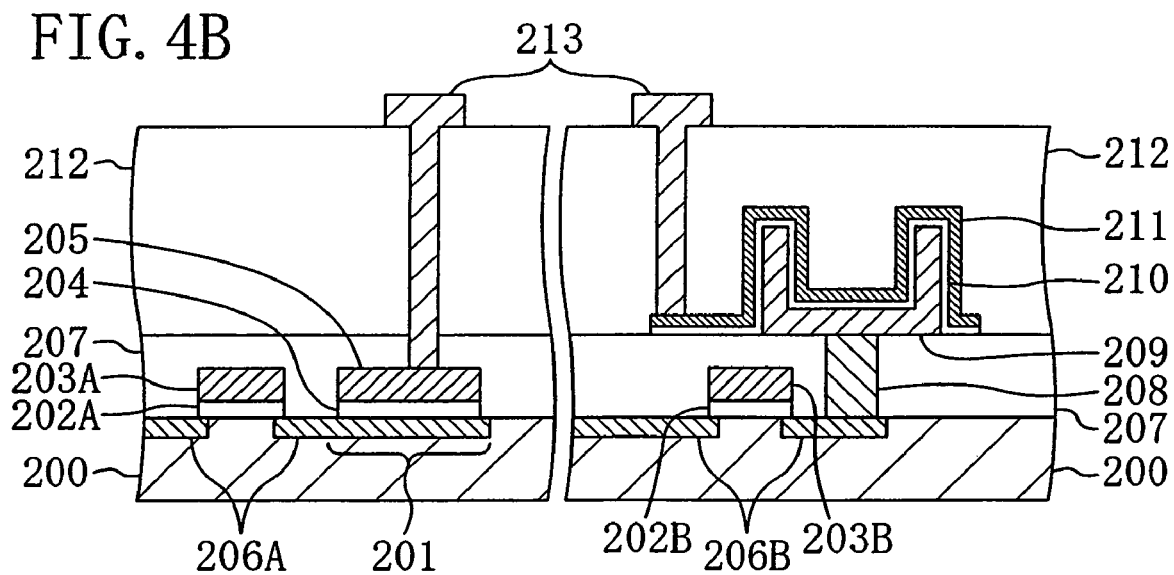

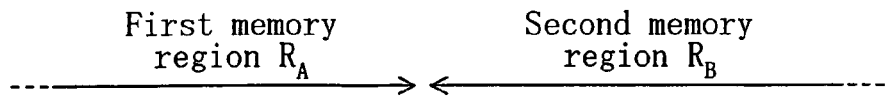
FIG. 6A
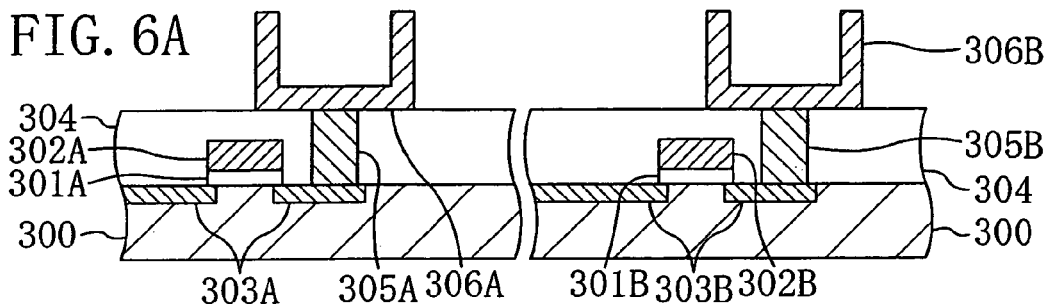
FIG. 6B
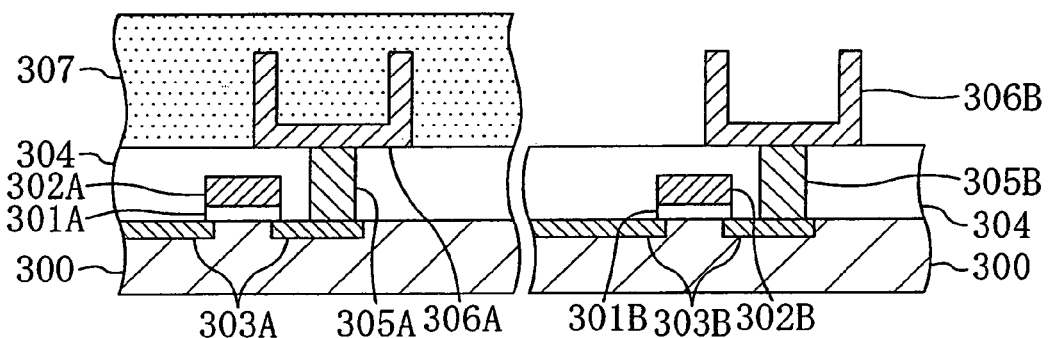
FIG. 6C
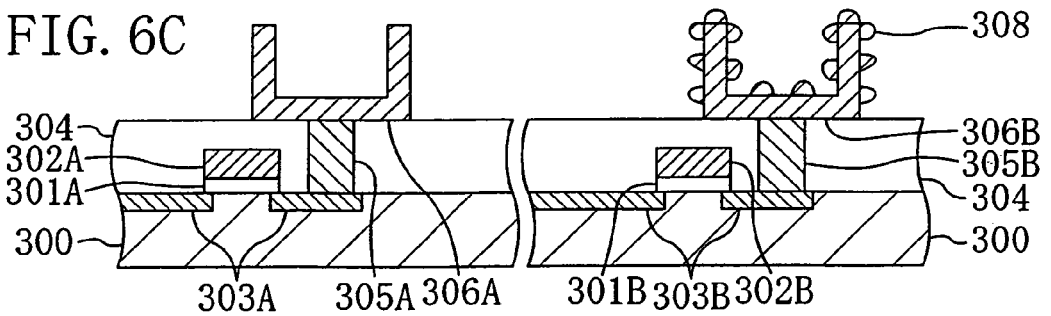
FIG. 6D
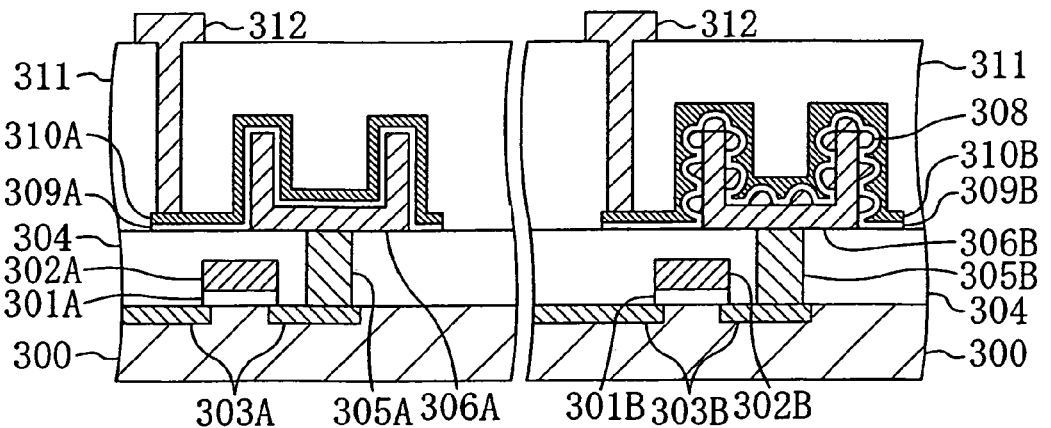

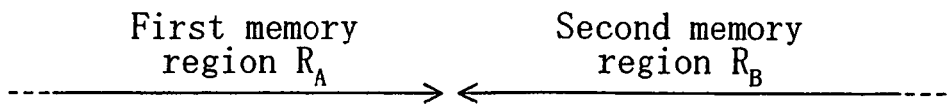
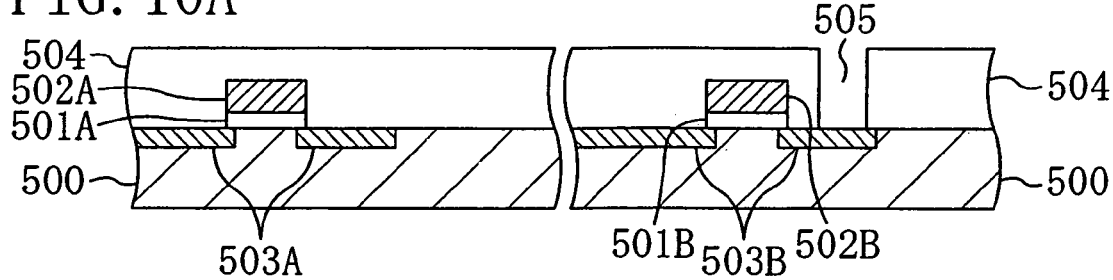
FIG. 10A
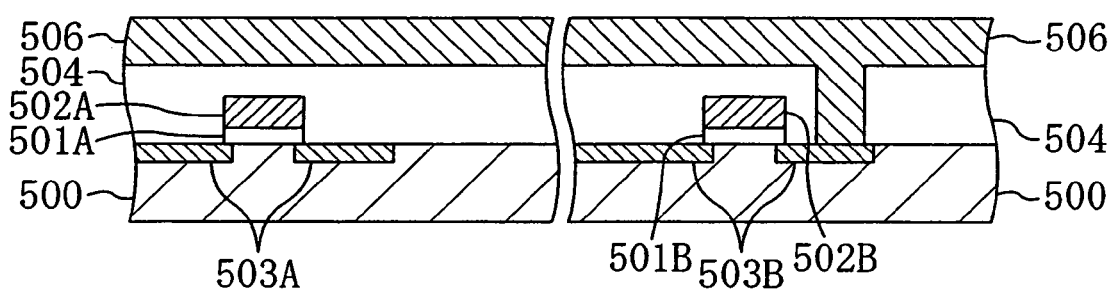
FIG. 10B
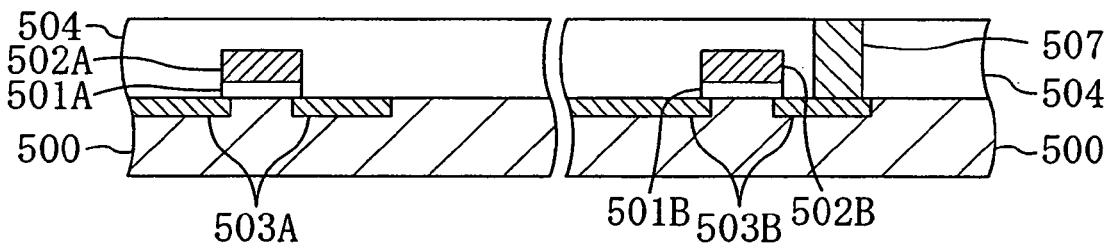
FIG. 10C
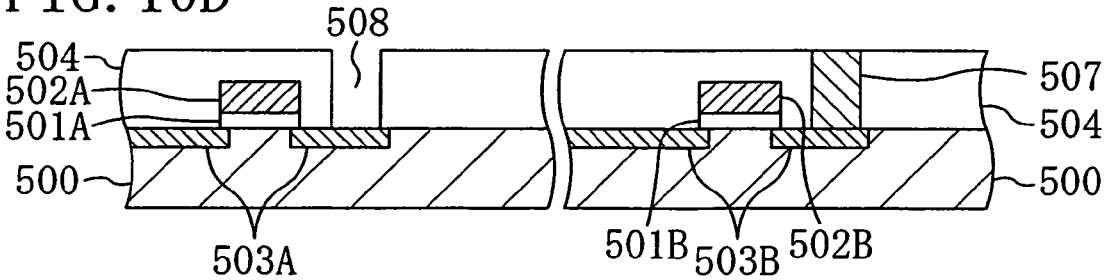
FIG. 10D
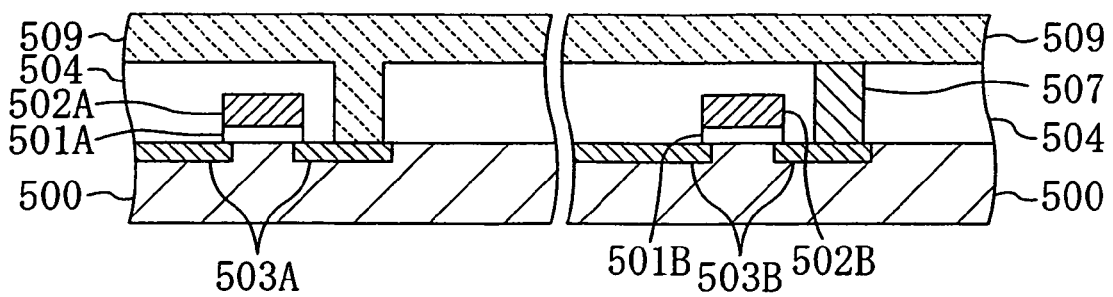
FIG. 10E

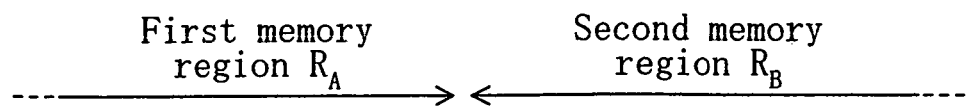
FIG. 11A
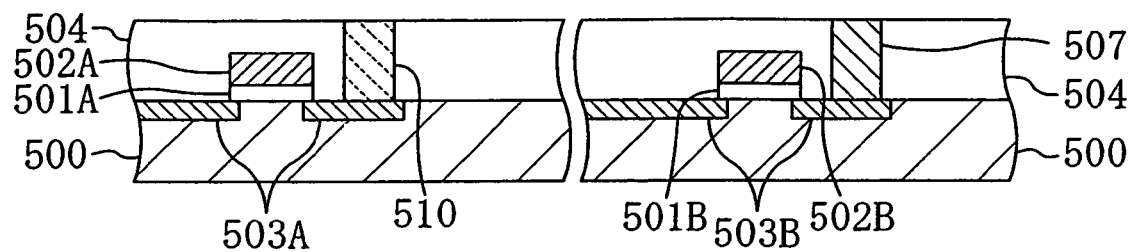
FIG. 11B
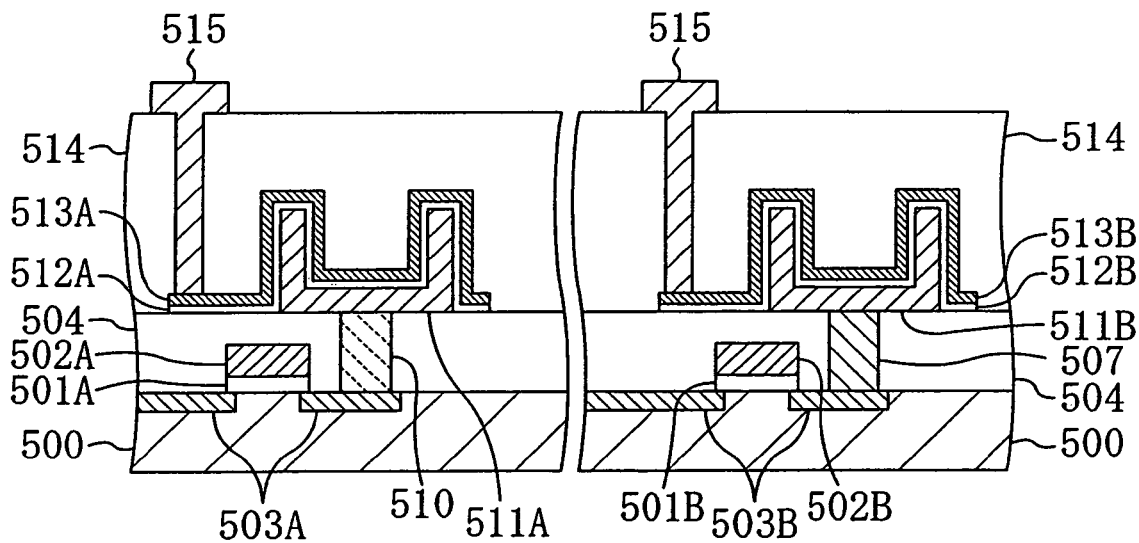

SEMICONDUCTOR DEVICE AND METHOD FOR MANUFACTURING THE SAME

RELATED APPLICATIONS

This application is a Divisional of U.S. application Ser. No. 11/189,896, filed Jul. 27, 2005, now abandoned which is a Divisional of U.S. application Ser. No. 10/694,891, filed Oct. 29, 2003, now U.S. Pat. No. 6,956,261, claiming priority of Japanese Application No. 2003-023542, filed Jan. 31, 2003, the entire contents of each of which are hereby incorporated by reference.

BACKGROUND OF THE INVENTION

The present invention relates to a semiconductor device in which a CMOS logic section and a plurality of DRAM sections used for different applications are formed together on the same semiconductor substrate, and more particularly to a DRAM-embedded system LSI having a reduced power consumption and an increased processing speed while ensuring a sufficient signal holding characteristic.

In recent years, DRAM-embedded system LSI chips have been attracting public attention. In a DRAM-embedded system LSI chip, a CMOS (complementary metal oxide semiconductor) logic section and a general-purpose DRAM (dynamic random access memory) section as a memory device, which used to be formed on separate chips, are formed together on the same chip.

For example, a DRAM-embedded system LSI chip used for an image processing application, or the like, includes a DRAM section as a memory device for storing an image information signal, and a CMOS logic section for retrieving necessary information from the DRAM section and performing an arithmetic operation based on the retrieved information, and the DRAM section and the CMOS logic section are formed together on the same chip.

A DRAM-embedded system LSI chip as described above realizes a higher communication speed than that realized by older techniques where data or information is exchanged between a CMOS logic section and a DRAM section that are formed on separate chips. A semiconductor device in which a CMOS logic section and a plurality of DRAM sections are formed together on the same chip includes a CMOS logic section formed on a silicon substrate, for example, and a DRAM section including cell capacitors (memory cell capacitors) of a particular type formed in the silicon substrate ("trench capacitors") or on the silicon substrate ("stacked capacitors").

It was technically difficult to form a CMOS logic section and a DRAM section together on the same chip because they had large areas. However, with recent miniaturization techniques, a DRAM-embedded system LSI chip having a chip size less than or equal to 100 mm² has been realized. Now, a plurality of CMOS logic sections and a plurality of application-specific DRAM sections are formed on the same chip, whereas a single chip accommodated only one CMOS logic section and one application-specific DRAM section with older techniques.

However, the DRAM sections formed on a conventional DRAM-embedded system LSI chip all have cell capacitors of the same structure. Therefore, it is difficult to provide, on the same chip, a DRAM section that needs to be accessed at a high speed and a DRAM section that requires a sufficient signal holding characteristic. This problem will be further discussed below.

FIG. 12A is a plan view illustrating a general configuration of a conventional DRAM-embedded system LSI chip.

As illustrated in FIG. 12A, a CMOS logic section 11 is formed on a chip 10, and a first DRAM section 12 and a second DRAM section 13 having the same cell capacitor structure are formed on the same chip 10. The first DRAM section 12 is associated with the CMOS logic section 11 and needs to operate at a high speed. On the other hand, the second DRAM section 13 is intended to operate at a low power consumption with a sufficient signal holding characteristic.

The value of a signal stored in each memory cell of a DRAM is determined based on the charge stored in the capacitor of the memory cell. FIG. 12B is a graph illustrating the relationship between the reference charge and the charge stored in a cell capacitor of the first DRAM section 12 and the second DRAM section 13 illustrated in FIG. 12A. Referring to FIG. 12B, where the reference charge, based on which the value of a signal is determined, is set to Qs, the value of a signal stored in a memory cell of the first DRAM section 12 and the second DRAM section 13 is determined to be "high" when a charge Qh, which is larger than the reference charge Qs, is stored in the cell capacitor and to be "low" when a charge Ql, which is smaller than the reference charge Qs, is stored in the cell capacitor.

However, even if the charge Qh is stored in the cell capacitor (whereby the signal stored in the memory cell is supposed to be determined to be "high"), the state of the signal being held may change over time due to, for example, a leak current through the capacitor insulating film of the cell capacitor, an OFF-state leak current through the transfer gate, or a leak current from the substrate contact portion (a portion where the cell capacitor and the semiconductor substrate are connected to each other) to the semiconductor substrate. As a result, even if a charge that is large enough for the signal to be determined "high" is initially stored in a cell capacitor of the DRAM section, the stored charge may gradually leak out over time, whereby the signal of the cell capacitor is no longer determined to be "high". Where Qh is the charge initially stored in a cell capacitor, t is the charge holding time, which is the amount of time elapsed since the charge Qh is initially stored, Q' is the amount of charge stored in the cell capacitor after the charge holding time t, and $I_{leak}$ is the amount of leak current, i.e., the amount of charge that leaks out of the cell capacitor, Q' can be expressed as in Expression (1) below. For the sake of simplicity, it is assumed that the leak current is constant over time.

$$Q' = Qh - I_{leak} \cdot t \quad (1)$$

As can be seen from Expression (1), the charge stored in the cell capacitor of the DRAM section decreases over time. Therefore, where a sufficient signal holding characteristic is required (i.e., where it is required that the charge holding time t, which is the amount of time until the charge Q' decreases to be less than or equal to Qs, is long), the charge Qh initially stored in the cell capacitor needs to be increased. Thus, the capacitance of the cell capacitor needs to be as large as about 30 fF.

FIG. 12C is an equivalent circuit diagram illustrating a memory cell of the second DRAM section 13 (the DRAM section that is intended to hold a signal written thereto sufficiently long) illustrated in FIG. 12A. In the figure, "C" denotes a cell capacitor, and "T" denotes a transfer gate. Where the capacitance of the cell capacitor C is set to 30 fF, a charge of 30 fC is stored in the cell capacitor C when a voltage $V_D$ applied across the cell capacitor C is set to 1.0 V.

On the other hand, for the first DRAM section 12 (the DRAM section to which signals are written at a high speed), a signal written to a memory cell needs to be transitioned from "low" to "high" and from "high" to "low" at a high speed, whereby the charge stored in the cell capacitor needs to be moved at a high speed. Therefore, a large amount of charge being stored in the cell capacitor means a large amount of charge that needs to be moved at a high speed. Thus, as the capacitance of the cell capacitor is increased, a larger amount of charge will need to be moved, thereby failing to realize a reduced power consumption and an increased processing speed.

Moreover, for devices that are intended for use with portable terminals, or the like, a plurality of DRAM sections formed on the same semiconductor substrate have different operating voltages. For example, the operating voltage of a DRAM section that is required to provide a high processing speed is 2.5 V or 3.3 V, while the operating voltage of a DRAM section that is required to operate at a low power consumption is 1.5 V or 1.2 V. Accordingly, the cell capacitors of these DRAM sections are controlled by the different operating voltages of 2.5 V or 3.3 V and 1.5 V or 1.2 V. If the cell capacitors of the memory cells are of the same structure, a cell capacitor of the DRAM section of the lower operating voltage stores a smaller amount of charge therein. Therefore, the capacitance of the cell capacitor needs to be set so that the amount of charge stored in a cell capacitor of the DRAM section of the lower operating voltage is larger than the reference charge. Thus, the capacitance of the cell capacitors forming the memory cells of the other DRAM section of the higher operating voltage is set equally. Therefore, a cell capacitor of the DRAM section that is controlled by the higher operating voltage stores more charge than necessary, thereby lowering the operating speed and increasing the power consumption.

SUMMARY OF THE INVENTION

In view of the above, it is an object of the present invention to provide a DRAM-embedded device in which a CMOS logic section and a plurality of DRAM sections used for different applications are formed together on the same semiconductor substrate, and which realizes both a reduced power consumption and an increased processing speed while ensuring a sufficient signal holding characteristic.

A first semiconductor device of the present invention is a semiconductor device, including a first DRAM section including a first memory cell having a first capacitance and a second DRAM section including a second memory cell having a second capacitance different from the first capacitance, the first DRAM section and the second DRAM section being provided on the same semiconductor substrate.

In the first semiconductor device, the first DRAM section and second DRAM section are provided on the same semiconductor substrate, and the first capacitance set for the first memory cell of the first DRAM section is different from the second capacitance set for the second memory cell of the second DRAM section. If the first capacitance is set to be smaller than the second capacitance, the charge stored in the capacitor of the first memory cell is smaller than that stored in the capacitor of the second memory cell. Therefore, in the first DRAM section, it is not necessary to move a large amount of charge for signal processing, and thus it is possible to reduce the power consumption and to quickly move the charge, thereby realizing high-speed signal processing. On the other hand, in the second DRAM section, a large amount of charge is stored, thereby realizing a sufficient signal holding characteristic.

Thus, in the first semiconductor device, a plurality of DRAM sections are provided by using a plurality of types of memory cells having different capacitances, whereby the capacitance of the memory cell of each DRAM section can be optimized according to the application of the DRAM section. Therefore, in a DRAM-embedded device in which a CMOS logic section and a plurality of DRAM sections are formed together on the same chip, it is possible to realize both a reduced power consumption and an increased processing speed while ensuring a sufficient signal holding characteristic.

In the first semiconductor device, it is preferred that an operating voltage of the first DRAM section is higher than that of the second DRAM section, and the first capacitance is smaller than the second capacitance.

In this way, the first capacitance of the first memory cell in the first DRAM section of the higher operating voltage is set to be relatively small, while the second capacitance of the second memory cell in the second DRAM section of the lower operating voltage is set to be relatively large. Thus, those effects provided by the first semiconductor device can reliably be obtained. The reason therefor will now be described. Where a plurality of DRAM sections of different operating voltages are provided on the same semiconductor substrate with the memory cells of all the DRAM sections having an equal capacitance, a larger amount of charge is stored in the capacitive element of the memory cell of a DRAM section of a higher operating voltage than in that of the memory cell of another DRAM section of a lower operating voltage. However, the capacitance of the memory cell in a DRAM section of a lower operating voltage needs to be set so that a charge greater than the reference charge is stored in the capacitive element. In such a case, more charge than necessary is stored in the capacitive element of the memory cell in the DRAM section of the higher operating voltage. As a result, it is necessary to move the stored charge, which is more than necessary, for signal processing, thereby reducing the operating speed and increasing the power consumption. Thus, even when a plurality of DRAM sections of different operating voltages are provided, those effects provided by the first semiconductor device can reliably be obtained by optimizing the capacitance of the capacitive element for each DRAM section according to the application thereof by setting the first capacitance of the first memory cell in the first DRAM section of the higher operating voltage to be relatively small, while setting the second capacitance of the second memory cell in the second DRAM section of the lower operating voltage to be relatively large.

In the first semiconductor device, it is preferred that a capacitor lower electrode of the first memory cell is provided in the semiconductor substrate, whereas neither of a capacitor upper electrode and a capacitor lower electrode of the second memory cell is provided in the semiconductor substrate.

Thus, the capacitor lower electrode of the first memory cell is provided in the semiconductor substrate, whereas the capacitor lower electrode and the capacitor upper electrode of the second memory cell are not provided in the semiconductor substrate, whereby the area where the capacitive element of the second memory cell is formed can be larger than that where the capacitive element of the first memory cell is formed. As a result, those effects provided by the first semiconductor device can reliably be obtained by setting the first capacitance of the first memory cell to be smaller than the second capacitance of the second memory cell.

Moreover, since the capacitor lower electrode of the first memory cell is provided in the semiconductor substrate, there is no plug for connecting the capacitive element of the first memory cell to the semiconductor substrate. Accordingly, the resistance (contact resistance) at the junction between the plug and the semiconductor substrate and the resistance of the plug itself are absent. As a result, in the first DRAM section including the first memory cell, the resistance to the charge movement for signal processing is low, thereby realizing high-speed processing. In contrast, the capacitor lower electrode and the capacitor upper electrode of the second memory cell are not provided in the semiconductor substrate, whereby it is necessary to provide a plug for connecting the capacitive element of the second memory cell to the semiconductor substrate. Thus, there is a contact resistance between the plug and the semiconductor substrate, and there is a resistance of the plug itself. As a result, the leak current, which occurs due to the charge stored in the capacitive element of the second memory cell leaking to the semiconductor substrate via the plug, is reduced. Thus, in the second DRAM section including the second memory cell, the charge stored in the capacitive element is unlikely to leak, whereby it is possible to hold the signal stored therein sufficiently long and to reduce the amount of power that is used for recharging the capacitive element.

Thus, in a DRAM-embedded device in which a CMOS logic section and a plurality of DRAM sections are formed together on the same chip, it is possible to realize both a reduced power consumption and an increased processing speed while ensuring a sufficient signal holding characteristic, by optimizing the resistance occurring due to the connection between the capacitive element of the memory cell and the semiconductor substrate for each DRAM section according to the application thereof, as described above.

Moreover, since the capacitor lower electrode of the first memory cell is provided in the semiconductor substrate, it is possible to save the distance over which a charge would otherwise have to be moved between the capacitive element of the first memory cell and the semiconductor substrate. Therefore, the charge movement can be completed quickly, and thus a signal can be stored in the first memory cell at a high speed. Thus, in the first DRAM section including the first memory cell, it is possible to realize high-speed signal processing.

In the first semiconductor device, it is preferred that a capacitor lower electrode of the first memory cell is made of silicon and a surface thereof is not roughened, whereas a capacitor lower electrode of the second memory cell is made of silicon and a surface thereof is roughened.

In this way, the surface of the capacitor lower electrode of the second memory cell is selectively roughened, whereby the surface area of the capacitor lower electrode of the second memory cell is larger than that of the capacitor lower electrode of the first memory cell. Thus, the second capacitance of the second memory cell can be set to be larger than the first capacitance of the first memory cell. Therefore, those effects provided by the first semiconductor device can reliably be obtained.

Moreover, effects as described above can reliably be obtained while employing the same structure and the same material for the first memory cell and the second memory cell, as long as the surface of the capacitor lower electrode of the second memory cell is roughened.

In the first semiconductor device, it is preferred that different materials are used for a capacitor insulating film of the first memory cell and for a capacitor insulating film of the second memory cell.

Thus, different materials are used for the capacitor insulating film of the first memory cell and for that of the second memory cell, whereby the second capacitance of the second memory cell can be set to be larger than the first capacitance of the first memory cell, for example, by using the difference between the dielectric constants of these materials. Therefore, those effects provided by the first semiconductor device can reliably be obtained.

A second semiconductor device of the present invention is a semiconductor device, including a first DRAM section including a first memory cell having a first capacitive element and a second DRAM section including a second memory cell having a second capacitive element, the first DRAM section and the second DRAM section being provided on the same substrate, wherein: the semiconductor substrate and the first capacitive element are connected to each other by a first plug, and the semiconductor substrate and the second capacitive element are connected to each other by a second plug; and different materials are used for the first plug and for the second plug.

In the second semiconductor device, the first DRAM section and the second DRAM section, which are different from each other, are provided on the same semiconductor substrate, and different materials are used for the first plug in the first DRAM section for connecting the first capacitive element to the semiconductor substrate and for the second plug in the second DRAM section for connecting the second capacitive element to the semiconductor substrate. Therefore, the resistances (contact resistances) at the junction between the first and second plugs and the semiconductor substrate and the resistances of the first and second plugs can be optimized individually according to the applications of the first DRAM section and the second DRAM section. Consider a case where the total resistance of the contact resistance between the first plug and the semiconductor substrate and the resistance of the first plug itself is smaller than the total resistance of the contact resistance between the second plug and the semiconductor substrate and the resistance of the second plug itself. In such a case, in the first DRAM section including the first memory cell having the first plug, the resistance to the charge movement for signal processing is low, thereby realizing high-speed signal processing. In contrast, in the second DRAM section including the second memory cell having the second plug, the resistance is high as described above, whereby the leak current, which occurs due to the charge stored in the second capacitive element leaking to the semiconductor substrate via the second plug, is reduced. Therefore, in the second DRAM section, it is possible to hold the signal stored therein sufficiently long and to reduce the amount of power that is used for recharging the capacitive element.

Thus, in the second semiconductor device, a plurality of DRAM sections are provided using memory cells whose plugs for connecting the capacitive element to the semiconductor substrate are different from each other, whereby it is possible to optimize the resistance occurring due to the connection between the capacitive element and the semiconductor substrate for each DRAM section according to the application thereof. Therefore, in a DRAM-embedded device in which a CMOS logic section and a plurality of DRAM sections are formed together on the same chip, it is possible to realize both a reduced power consumption and an increased processing speed while ensuring a sufficient signal holding characteristic.

In the second semiconductor device, it is preferred that a contact resistance between the first plug and the semiconductor substrate is different from that between the second plug and the semiconductor substrate.

In this way, the contact resistances between the first and second plugs and the semiconductor substrate can be optimized individually. For example, when a silicide layer is formed on the semiconductor substrate connected to one of the first plug and the second plug, the contact resistance can be reduced. Therefore, those effects provided by the second semiconductor device can reliably be obtained.

A first method for manufacturing a semiconductor device of the present invention is a method for manufacturing a semiconductor device, including the steps of: successively forming a first capacitor insulating film and a first capacitor upper electrode on a semiconductor substrate in a first memory region, thereby forming a first capacitive element; forming an interlayer insulating film on the semiconductor substrate, on which the first capacitive element has been formed; forming a plug connected to the semiconductor substrate in the interlayer insulating film in a second memory region; and successively forming a second capacitor lower electrode connected to the plug, a second capacitor insulating film and a second capacitor upper electrode on the interlayer insulating film in the second memory region, thereby forming a second capacitive element.

According to the first method for manufacturing a semiconductor device, the first capacitive element and the second capacitive element having different structures are formed on the same semiconductor substrate in the first memory region and the second memory region, respectively. In the first memory region, the first capacitive element is formed directly on the semiconductor substrate. In contrast, in the second memory region, the second capacitive element is formed on a plug, which is formed in the interlayer insulating film formed on the semiconductor substrate, whereby the area where the second capacitive element is formed can be larger than that where the first capacitive element is formed in the first memory region. Thus, the capacitance of the first capacitive element in the first memory region can be set to be smaller than that of the second capacitive element in the second memory region. Therefore, where the DRAM section including the memory cell having the first capacitive element is formed in the first memory region, it is not necessary in that DRAM section to move a large amount of charge for signal processing and thus it is possible to reduce the power consumption and to quickly move the charge, thereby realizing high-speed signal processing. On the other hand, where the DRAM section including the memory cell having the second capacitive element is formed in the second memory region, a large amount of charge is stored in that DRAM section, thereby satisfying a sufficient signal holding characteristic.

Thus, according to the first method for manufacturing a semiconductor device, a plurality of DRAM sections are provided using a plurality of types of capacitive elements having different capacitances, whereby it is possible to optimize the capacitance of the capacitive element for each DRAM section according to the application thereof. Therefore, in a DRAM-embedded device in which a CMOS logic section and a plurality of DRAM sections are formed together on the same chip, it is possible to realize both a reduced power consumption and an increased processing speed while ensuring a sufficient signal holding characteristic.

Moreover, in the first memory region, the first capacitive element is formed directly on the semiconductor substrate, whereby it is not necessary to form a plug for connecting the first capacitive element to the semiconductor substrate. Accordingly, the contact resistance between the plug and the semiconductor substrate and the resistance of the plug itself are absent. As a result, where the DRAM section including the memory cell having the first capacitive element is formed in the first memory region, the resistance to the charge movement for signal processing is low in that DRAM section, thereby realizing high-speed processing. In contrast, in the second memory region, the second capacitive element is formed on a plug, which is formed in the interlayer insulating film on the semiconductor substrate, whereby there is a contact resistance between the plug and the semiconductor substrate, and there is a resistance of the plug itself. As a result, the leak current, which occurs due to the charge stored in the first capacitive element leaking to the semiconductor substrate via the plug, is reduced. Thus, where the DRAM section including the memory cell having the second capacitive element is formed in the second memory region, the charge is unlikely to leak from the second capacitive element in that DRAM section, whereby it is possible to hold the signal stored therein sufficiently long and to reduce the amount of power that is used for recharging the capacitive element.

Thus, according to the first method for manufacturing a semiconductor device, the resistance occurring due to the connection between the semiconductor substrate and the capacitive element can be optimized for each DRAM section according to the application thereof. Therefore, in a DRAM-embedded device in which a CMOS logic section and a plurality of DRAM sections are formed together on the same chip, it is possible to realize both a reduced power consumption and an increased processing speed while ensuring a sufficient signal holding characteristic.

Moreover, in the first memory region, the first capacitive element is formed directly on the semiconductor substrate, whereby it is possible to save the distance over which a charge would otherwise have to be moved between the first capacitive element and the semiconductor substrate. Therefore, the charge movement can be completed quickly, and thus a signal can be stored in the first capacitive element at a high speed. Thus, in the DRAM section including the memory cell having the first capacitive element, it is possible to realize high-speed signal processing.

A second method for manufacturing a semiconductor device of the present invention is a method for manufacturing a semiconductor device, including the steps of: forming an interlayer insulating film on a semiconductor substrate; forming a first plug and a second plug connected to the semiconductor substrate in the interlayer insulating film in a first memory region and in a second memory region, respectively; forming a first capacitor lower electrode, which is made of silicon and connected to the first plug, on the interlayer insulating film in the first memory region, and forming a second capacitor lower electrode, which is made of silicon and connected to the second plug, on the interlayer insulating film in the second memory region; selectively roughening only a surface of the second capacitor lower electrode; and forming a first capacitor upper electrode on the first capacitor lower electrode with a first capacitor insulating film interposed therebetween, thereby forming a first capacitive element, and forming a second capacitor upper electrode on the roughened second capacitor lower electrode with a second capacitor insulating film interposed therebetween, thereby forming a second capacitive element.

According to the second method for manufacturing a semiconductor device, the first capacitive element and the second capacitive element, which are different from each other, are formed on the same semiconductor substrate in the first memory region and the second memory region, respectively. The surface of only the second capacitor lower electrode in the second memory region is selectively roughened. Therefore, the surface area of the second capacitor lower electrode in the second memory region is larger than that of the first capacitor lower electrode in the first memory region. Thus, the capacitance of the second capacitive element is larger than that of the first capacitive element. As a result, where the DRAM section including the memory cell having the first capacitive element is formed in the first memory region, it is not necessary in that DRAM section to move a large amount of charge for signal processing and thus it is possible to reduce the power consumption and to quickly move the charge, thereby realizing high-speed signal processing. On the other hand, where the DRAM section including the memory cell having the second capacitive element is formed in the second memory region, a large amount of charge is stored in that DRAM section, thereby satisfying a sufficient signal holding characteristic.

Thus, according to the second method for manufacturing a semiconductor device, a plurality of DRAM sections are provided by using a plurality of types of capacitive elements having different capacitances, whereby it is possible to optimize the capacitance of the capacitive element for each DRAM section according to the application thereof. Therefore, in a DRAM-embedded device in which a CMOS logic section and a plurality of DRAM sections are formed together on the same chip, it is possible to realize both a reduced power consumption and an increased processing speed while ensuring a sufficient signal holding characteristic.

Moreover, effects as described above can reliably be obtained while employing the same structure and the same material for the memory cell having the first capacitive element and for the memory cell having the second capacitive element, as long as the surface of the second capacitor lower electrode in the second memory region is roughened.

In the second method for manufacturing a semiconductor device, it is preferred that a step of removing a native oxide film covering the surface of the second capacitor lower electrode by using hydrofluoric acid is performed between the step of forming the first and second capacitor lower electrodes and the step of roughening the surface of the second capacitor lower electrode; and the step of roughening the surface of the second capacitor lower electrode includes a step of subjecting the semiconductor substrate to a heat treatment in a silicon-containing gas atmosphere.

In this way, the native oxide film covering the surface of the second capacitor lower electrode can be removed by using hydrofluoric acid before the surface of the second capacitor lower electrode is roughened. Therefore, particles in a silicon-containing gas can reliably be attached to the surface of the second capacitor lower electrode through the heat treatment on the semiconductor substrate in a silicon-containing gas atmosphere. As a result, hemispherical grains are reliably formed on the surface of the second capacitor lower electrode, whereby the surface area of the second capacitor lower electrode can reliably be larger than that of the first capacitor lower electrode. Therefore, those effects provided by the second method for manufacturing a semiconductor device can reliably be obtained.

A third method for manufacturing a semiconductor device of the present invention is a method for manufacturing a semiconductor device, including the steps of: forming an interlayer insulating film on a semiconductor substrate; forming a first plug and a second plug connected to the semiconductor substrate in the interlayer insulating film in a first memory region and in a second memory region, respectively; forming a first capacitor lower electrode, which is made of silicon and connected to the first plug, on the interlayer insulating film in the first memory region, and forming a second capacitor lower electrode, which is made of silicon and connected to the second plug, on the interlayer insulating film in the second memory region; forming a first capacitor insulating film made of a first material on the first capacitor lower electrode, and forming a second capacitor insulating film made of a second material different from the first material on the second capacitor lower electrode; and forming a first capacitor upper electrode on the first capacitor insulating film, thereby forming a first capacitive element, and forming a second capacitor upper electrode on the second capacitor insulating film, thereby forming a second capacitive element.

According to the third method for manufacturing a semiconductor device, the first capacitive element and the second capacitive element, which are different from each other, are formed on the same semiconductor substrate in the first memory region and the second memory region, respectively. The first material and the second material, which are different from each other, are used for the first capacitor insulating film of the first capacitive element and for the second capacitor insulating film of the second capacitive element, respectively. Therefore, the capacitance of the first capacitive element can be set to be different from that of the second capacitive element. Assuming that the capacitance of the first capacitive element is smaller than that of the second capacitive element, where the DRAM section including the memory cell having the first capacitive element is formed in the first memory region, it is not necessary in that DRAM section to move a large amount of charge for signal processing and thus it is possible to reduce the power consumption and to quickly move the charge, thereby realizing high-speed signal processing. On the other hand, where the DRAM section including the memory cell having the second capacitive element is formed in the second memory region, a large amount of charge is stored in that DRAM section, thereby satisfying a sufficient signal holding characteristic.

Thus, according to the third method for manufacturing a semiconductor device, a plurality of DRAM sections are provided by using a plurality of types of capacitive elements having different capacitances, whereby it is possible to optimize the capacitance of the capacitive element for each DRAM section according to the application thereof. Therefore, in a DRAM-embedded device in which a CMOS logic section and a plurality of DRAM sections are formed together on the same chip, it is possible to realize both a reduced power consumption and an increased processing speed while ensuring a sufficient signal holding characteristic.

A fourth method for manufacturing a semiconductor device of the present invention is a method for manufacturing a semiconductor device, including the steps of: forming an interlayer insulating film on a semiconductor substrate; forming a first hole reaching the semiconductor substrate in the interlayer insulating film in a first memory region; forming a first plug made of a metal film in the first hole; forming a second hole reaching the semiconductor substrate in the interlayer insulating film in a second memory region; forming a second plug made of a silicon film in the second hole; and successively forming a first capacitor lower electrode connected to the first plug, a first capacitor insulating film and a first capacitor upper electrode on the interlayer insulating film in the first memory region, thereby forming a first capacitive element, and successively forming a second capacitor lower electrode connected to the second plug, a second capacitor insulating film and a second capacitor upper electrode on the interlayer insulating film in the second memory region, thereby forming a second capacitive element.

According to the fourth method for manufacturing a semiconductor device, the first capacitive element and the second capacitive element are formed on the same semiconductor substrate in the first memory region and the second memory region, respectively. The first plug, which is made of a metal film, is formed for connecting the first capacitive element in the first memory region to the semiconductor substrate, and the second plug, which is made of a silicon film, is formed for connecting the second capacitive element in the second memory region to the semiconductor substrate. Thus, the resistance of the first plug can be made lower than that of the second plug. Moreover, the contact resistance between the first plug and the semiconductor substrate can be made lower than that between the second plug and the semiconductor substrate. As a result, where the DRAM section including the memory cell having the first capacitive element is formed in the first memory region, the resistance to the charge movement for signal processing is low in that DRAM section, thereby realizing high-speed signal processing. In contrast, where the DRAM section including the memory cell having the second capacitive element is formed in the second memory region, the resistance between the second capacitive element and the semiconductor substrate is relatively high in that DRAM section, whereby the leak current, which occurs due to the charge stored in the second capacitive element leaking to the semiconductor substrate via the second plug, is reduced. As a result, the charge stored in the second capacitive element is unlikely to leak, whereby it is possible to hold the signal stored therein sufficiently long and to reduce the power consumption.

Thus, according to the fourth method for manufacturing a semiconductor device, the resistance occurring due to the connection between the capacitive element and the semiconductor substrate via the plug can be optimized for each DRAM section according to the application thereof. Therefore, in a DRAM-embedded device in which a CMOS logic section and a plurality of DRAM sections are formed together on the same chip, it is possible to realize both a reduced power consumption and an increased processing speed while ensuring a sufficient signal holding characteristic.

Note that in the fourth method for manufacturing a semiconductor device, a silicide layer may be formed on the semiconductor substrate in advance before the formation of the first plug. Then, the contact resistance between the first plug and the semiconductor substrate is reduced, whereby those effects provided by the fourth method for manufacturing a semiconductor device can reliably be obtained.

Moreover, in the fourth method for manufacturing a semiconductor device, a step of forming a barrier metal film in the first hole may be performed between the step of forming the first hole and the step of forming the first plug.

BRIEF DESCRIPTION OF THE DRAWINGS

FIG. 3A to FIG. 3D are cross-sectional views illustrating steps in a method for manufacturing the semiconductor device according to the second embodiment of the present invention.

FIG. 4A and FIG. 4B are cross-sectional views illustrating steps in a method for manufacturing the semiconductor device according to the second embodiment of the present invention.

FIG. 6A to FIG. 6D are cross-sectional views illustrating steps in a method for manufacturing the semiconductor device according to the third embodiment of the present invention.

FIG. 10A to FIG. 10E are cross-sectional views illustrating steps in a method for manufacturing the semiconductor device according to the fifth embodiment of the present invention.

FIG. 11A and FIG. 11B are cross-sectional views illustrating steps in a method for manufacturing the semiconductor device according to the fifth embodiment of the present invention.

DETAILED DESCRIPTION OF THE INVENTION

First Embodiment

A semiconductor device according to the first embodiment of the present invention will now be described with reference to the drawings.

Figure 1A:
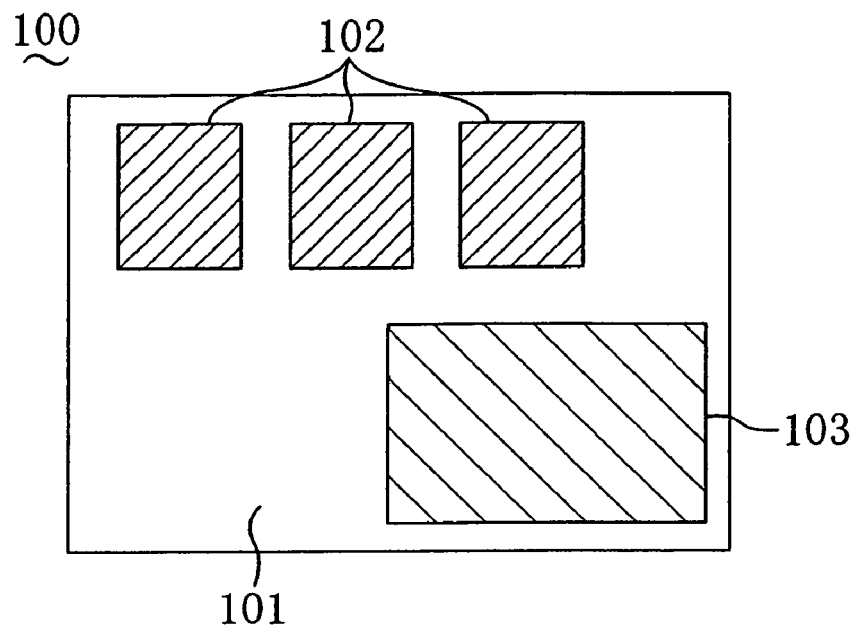
FIG. 1A is a plan view illustrating a general configuration of a semiconductor device according to first to fifth embodiments of the present invention.

FIG. 1A is a plan view illustrating a general configuration of the semiconductor device according to the first embodiment of the present invention.

As illustrated in FIG. 1A, a CMOS logic section 101 is formed on a chip 100, and a first DRAM section 102 and a second DRAM section 103 are formed on the same chip 100. The first DRAM section 102 is intended to provide temporary storage of data being processed at a high speed, i.e., to store a charge that is moved at a high speed. In contrast, the second DRAM section 103 is intended to hold a signal written thereto sufficiently long.

A feature of the present embodiment is that the capacitances of the memory cells of the first DRAM section 102 and the second DRAM section 103 are individually set for their respective applications.

Figure 1B:
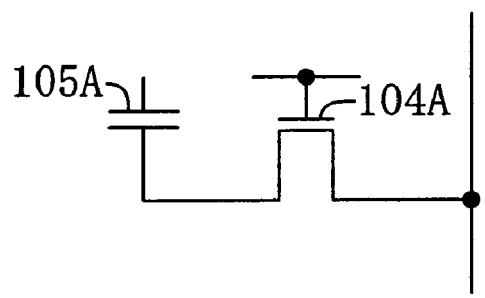
FIG. 1B and FIG. 1C are equivalent circuit diagrams illustrating memory cells of a first DRAM section and a second DRAM section, respectively, illustrated in FIG. 1A, and FIG. 1D and FIG. 1E are graphs illustrating the charge storing characteristics of cell capacitors of the first DRAM section and the second DRAM section, respectively, illustrated in FIG. 1A.
Figure 1C:
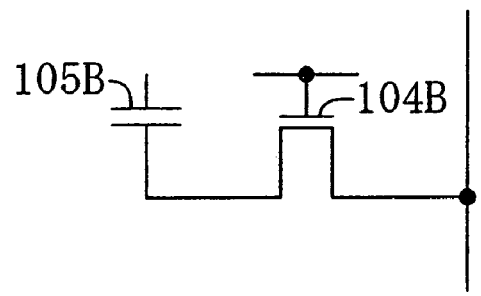

FIG. 1B and FIG. 1C are equivalent circuit diagrams illustrating memory cells of the first DRAM section 102 and the second DRAM section 103, respectively, illustrated in FIG. 1A.

As illustrated in FIG. 1B, a memory cell of the first DRAM section 102 includes a first transfer gate 104A and a first capacitor 105A. As illustrated in FIG. 1C, a memory cell of the second DRAM section 103 includes a second transfer gate 104B and a second capacitor 105B.

The charge storing characteristics of the first capacitor 105A and the second capacitor 105B will now be described, assuming that the capacitance of the first capacitor 105A is $C_a$, the power supply voltage of the first capacitor 105A is $V_{DDa}$, the plate voltage of the first capacitor 105A is $V_{Pa}$, the charge stored in the first capacitor 105A is $Q_a$, the capacitance of the second capacitor 105B is $C_b$, the power supply voltage of the second capacitor 105B is $V_{DDb}$, the plate voltage of the second capacitor 105B is $V_{Pb}$, and the charge stored in the second capacitor 105B is $Q_b$.

Figure 1D:
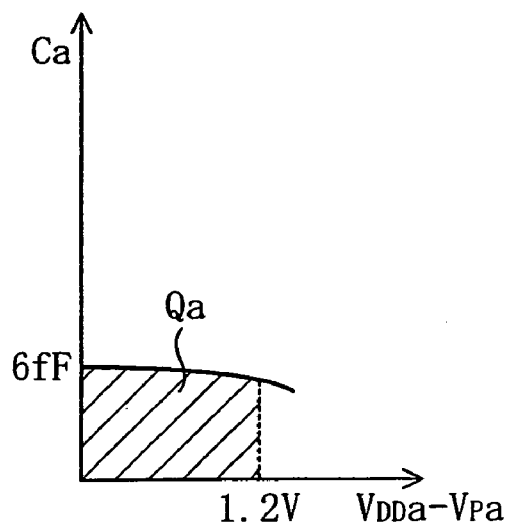
Figure 1E:
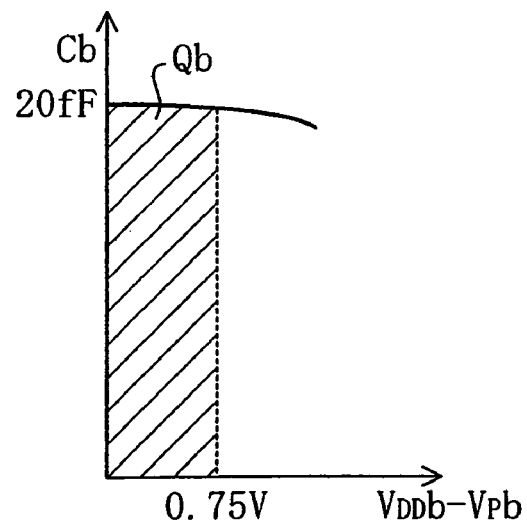

FIG. 1D is a graph illustrating the relationship between the capacitance $C_a$ of the first capacitor 105A illustrated in FIG. 1B and the operating voltage ($V_{DDa-VPa}$) applied between the electrodes of the first capacitor 105A. FIG. 1E is a graph illustrating the relationship between the capacitance $C_b$ of the second capacitor 105B illustrated in FIG. 1C and the operating voltage ($V_{DDb}-V_{Pb}$) applied between the electrodes of the second capacitor 105B. For example, $C_a$=6 fF and ($V_{DDa}-V_{Pa}$)=1.2 V for the first capacitor 105A of the first DRAM section 102, whereas $C_b$=20 fF and ($V_{DDb}-V_b$)=0.75 V for the second capacitor 105B of the second DRAM section 103. The amount of charge stored in the capacitors can be represented as a physical quantity whose value is equal to the area of the hatched portion in FIG. 1D and FIG. 1E. Therefore, the amount of charge stored in the first capacitor 105A is 7.2 fC based on Expression (2) below.

$$Q_a = C_a \cdot (V_{DDa} - V_{Pa}) = 6 \text{ fF} \cdot 1.2 \text{ V} = 7.2 \text{ fC} \quad (2)$$

On the other hand, the amount of charge stored in the second capacitor 105B is 15 fC based on Expression (3) below.

$$Q_b = C_b \cdot (V_{DDb} - V_b) = 20 \text{ fF} \cdot 0.75 \text{ V} = 15 \text{ fC} \quad (3)$$

Thus, the amount of charge stored in the first capacitor 105A is smaller than that in the second capacitor 105B by 7.8 fC. Therefore, according to the present embodiment, in the first DRAM section 102 of the higher operating voltage, it is not necessary to move a large amount of charge for signal processing, and thus it is possible to reduce the power consumption and to quickly move the charge, thereby realizing high-speed signal processing. On the other hand, in the second DRAM section 103, a large amount of charge is stored, thereby realizing a sufficient signal holding characteristic. Thus, it is possible to realize a DRAM-embedded device that realizes both a reduced power consumption and an increased processing speed while ensuring a sufficient signal holding characteristic, by optimizing the capacitance of a memory cell for each DRAM section according to the application thereof, as described above. Note that according to the present embodiment, the amount of charge stored in the first capacitor 105A is smaller than that where $C_a=C_b$=20 fF as in the conventional semiconductor device by 16.8 fC. Therefore, it is possible to save the power that would otherwise be used for moving the extra 16.8 fC charge. Moreover, since it is not necessary to move the extra amount of charge, it is possible to realize high-speed signal processing.

Note that in the first embodiment, the capacitance and applied voltage of each of the first capacitor 105A and the second capacitor 105B are arbitrarily determined within a certain range according to the purpose thereof. Note however that the charge $Q_a$ stored in the first capacitor 105A needs to be smaller than the charge $Q_b$ stored in the second capacitor 105B.

Moreover, the operating voltages of the first DRAM section 102 and the second DRAM section 103 are different from each other in the first embodiment, they may be equal to each other and similar effects can still be obtained, as long as the capacitance of the first capacitor 105A is set to be smaller than that of the second capacitor 105B.

Second Embodiment

A semiconductor device according to the second embodiment and a method for manufacturing the same will now be described with reference to the drawings. Also in the present embodiment, the general configuration of the semiconductor device is as shown in the plan view of FIG. 1A.

Figure 2:
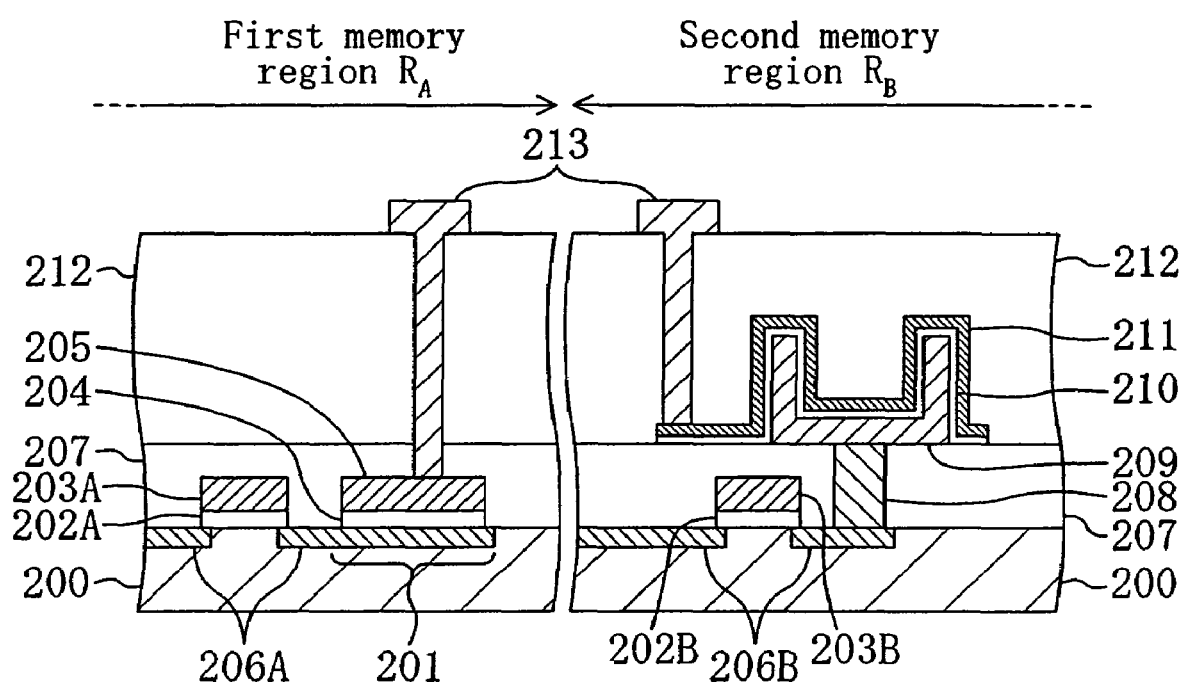
FIG. 2 is a cross-sectional view illustrating a semiconductor device according to the second embodiment of the present invention.

FIG. 2 is a cross-sectional view illustrating the semiconductor device according to the second embodiment. More specifically, FIG. 2 shows memory cells of the first DRAM section 102 and the second DRAM section 103 formed on the chip 100 illustrated in FIG. 1A. Note that the two regions where the first DRAM section 102 and the second DRAM section 103 are formed are referred to as "first memory region $R_A$" and "second memory region $R_B$", respectively.

As illustrated in FIG. 2, a first gate electrode 203A is formed on a semiconductor substrate 200 in the first memory region $R_A$ with a first gate insulating film 202A interposed between the semiconductor substrate 200 and the first gate electrode 203A. Thus, a transfer gate is formed in the first memory region $R_A$. A first capacitor upper electrode 205 is formed on the semiconductor substrate 200 in the first memory region $R_A$ with a first capacitor insulating film 204 interposed between the semiconductor substrate 200 and first capacitor upper electrode 205. A second gate electrode 203B is formed on the semiconductor substrate 200 in the second memory region $R_B$ with a second gate insulating film 202B interposed between the semiconductor substrate 200 and the second gate electrode 203B. Thus, a transfer gate is formed in the second memory region $R_B$. A first diffusion layer 206A is formed in the semiconductor substrate 200 beside the first gate electrode 203A. The first capacitor upper electrode 205 is formed on a diffusion layer 201 (first capacitor lower electrode), which is connected to the first diffusion layer 206A, with the first capacitor insulating film 204 interposed between the diffusion layer 201 and the first capacitor upper electrode 205. Thus, a cell capacitor of the first DRAM section 102 is formed in the first memory region $R_A$. A second diffusion layer 206B is formed in the semiconductor substrate 200 beside the second gate electrode 203B. A first interlayer insulating film 207 is formed on the semiconductor substrate 200, the first gate electrode 203A, the first capacitor upper electrode 205 and the second gate electrode 203B. A contact plug 208 connected to the second diffusion layer 206B is formed through the first interlayer insulating film 207 in the second memory region $R_B$. A second capacitor lower electrode 209 is formed on the first interlayer insulating film 207 in the second memory region $R_B$. The second capacitor lower electrode 209 has a tubular shape with a bottom surface and is connected to the contact plug 208. A second capacitor insulating film 210 is formed so as to cover the second capacitor lower electrode 209, and a second capacitor upper electrode 211 is formed so as to cover the second capacitor insulating film 210. Thus, a cell capacitor of the second DRAM section 103 is formed in the second memory region $R_B$. A second interlayer insulating film 212 is formed on the first interlayer insulating film 207 and the second capacitor upper electrode 211. A wiring layer 213 is formed on the second interlayer insulating film 212. The wiring layer 213 is formed so that portions thereof are connected to the first capacitor upper electrode 205 and the second capacitor upper electrode 211 through contact holes formed in the second interlayer insulating film 212.

Next, a method for manufacturing the semiconductor device according to the second embodiment will be described with reference to the drawings.

FIG. 3A to FIG. 3D, FIG. 4A and FIG. 4B are cross-sectional views illustrating steps in the method for manufacturing the semiconductor device according to the second embodiment. Note that in FIG. 3A to FIG. 3D, FIG. 4A and FIG. 4B, the same members as those of the semiconductor device of the second embodiment illustrated in FIG. 2 will be denoted by the same reference numerals.

First, as illustrated in FIG. 3A, an impurity is implanted into a cell capacitor formation region of the semiconductor substrate 200 in the first memory region $R_A$ so as to form the diffusion layer 201 to be the first capacitor lower electrode. Then, an insulating film 202, whose main component is silicon oxide, for example, and an electrode film 203, which is a silicon film or a silicon/metal layered film, for example, are successively formed across the entire surface of the semiconductor substrate 200.

Then, as illustrated in FIG. 3B, the electrode film 203 and the insulating film 202 are patterned by photolithography and etching. Thus, in the first memory region $R_A$, the first gate electrode 203A is formed on the semiconductor substrate 200 with the first gate insulating film 202A interposed between the semiconductor substrate 200 and the first gate electrode 203A, and the first capacitor upper electrode 205 is formed on the semiconductor substrate 200 with the first capacitor insulating film 204 interposed between the semiconductor substrate 200 and the first capacitor upper electrode 205. At the same time, in the second memory region $R_B$, the second gate electrode 203B is formed on the semiconductor substrate 200 with the second gate insulating film 202B interposed between the semiconductor substrate 200 and the second gate electrode 203B. Thus, a transfer gate is formed in each of the first memory region $R_A$ and the second memory region $R_B$, and a cell capacitor of the first DRAM section 102 is formed in the first memory region $R_A$.

Then, as illustrated in FIG. 3C, an impurity is implanted into the semiconductor substrate 200 in the first memory region $R_A$ and the second memory region $R_B$, thereby forming the first diffusion layer 206A and the second diffusion layer 206B, respectively. In this process, the first diffusion layer 206A is connected to the diffusion layer 201.

Then, as illustrated in FIG. 3D, the first interlayer insulating film 207 is formed across the entire surface of the semiconductor substrate 200. Then, in the second memory region $R_B$, a contact hole reaching the second diffusion layer 206B is formed in the first interlayer insulating film 207 by photolithography and etching. Then, a conductive film is formed across the entire surface of the semiconductor substrate 200 so as to completely fill the contact hole. Then, an unnecessary portion of the conductive film on the first interlayer insulating film 207 is removed, thereby forming the contact plug 208 connected to the second diffusion layer 206B through the contact hole.

Then, as illustrated in FIG. 4A, the second capacitor lower electrode 209 is formed on the first interlayer insulating film 207 in the second memory region $R_B$. The second capacitor lower electrode 209 has a tubular shape with a bottom surface and is connected to the contact plug 208. The second capacitor lower electrode 209 is made of phosphorus-containing silicon, for example. Then, the second capacitor insulating film 210, which is a layered film of a silicon oxide film and a silicon nitride film (ON film), for example, is formed so as to cover the second capacitor lower electrode 209, and the second capacitor upper electrode 211, which is made of phosphorus-containing silicon, for example, is formed so as to cover the second capacitor insulating film 210. Thus, a cell capacitor of the second DRAM section 103 is formed in the second memory region $R_B$.

Then, as illustrated in FIG. 4B, the second interlayer insulating film 212 is formed across the entire surface of the semiconductor substrate 200. Then, contact holes reaching the first capacitor upper electrode 205 and the second capacitor upper electrode 211 are formed in the second interlayer insulating film 212. Then, the wiring layer 213 is formed on the second interlayer insulating film 212. In this process, the wiring layer 213 is formed so that portions thereof are connected to the first capacitor upper electrode 205 and the second capacitor upper electrode 211. Thus, the first DRAM section 102 and the second DRAM section 103 are formed in the first memory region $R_A$ and the second memory region $R_B$, respectively.

According to the second embodiment, the cell capacitor formed in the first memory region $R_A$ includes the first capacitor lower electrode, which is formed from the diffusion layer 201 connected to the first diffusion layer 206A, the first capacitor insulating film 204, and the first capacitor upper electrode 205. Thus, the cell capacitor is a so-called "planar capacitor" formed directly on the semiconductor substrate 200. In contrast, the cell capacitor formed in the second memory region $R_B$ is a so-called "stacked capacitor" formed on the contact plug 208, which is formed in the first interlayer insulating film 207. Thus, in the second memory region $R_B$, a larger area can be used for forming the cell capacitor, as compared to the planar capacitor formed in the first memory region $R_A$. Furthermore, since the second capacitor lower electrode 209 formed in the second memory region $R_B$ has a tubular shape, the second capacitor lower electrode 209 has a larger surface area. Thus, the capacitance of the cell capacitor formed in the second memory region $R_B$ is larger than that of the cell capacitor formed in the first memory region $R_A$. Therefore, in the first DRAM section 102 where the cell capacitor formed in the first memory region $R_A$ is used as the capacitive element, it is not necessary to move a large amount of charge for signal processing, and thus it is possible to reduce the power consumption and to quickly move the charge, thereby realizing high-speed processing. On the other hand, in the second DRAM section 103 where the cell capacitor formed in the second memory region $R_B$ is used as the capacitive element, a large amount of charge can be stored, thereby realizing a sufficient signal holding characteristic.

Thus, it is possible to realize a DRAM-embedded device that realizes both a reduced power consumption and an increased processing speed while ensuring a sufficient signal holding characteristic, by optimizing the capacitance of the cell capacitor for each DRAM section according to the application thereof, as in the present embodiment.

Moreover, according to the second embodiment, the cell capacitor of the first memory region $R_A$ is formed directly on the semiconductor substrate 200, whereby there is no contact plug for connecting the cell capacitor to the first diffusion layer 206A. Accordingly, the contact resistance between the contact plug and the first diffusion layer 206A and the resistance of the contact plug itself are absent. Thus, in the first memory region $R_A$ the resistance from the transfer gate to the first capacitor lower electrode (the diffusion layer 201) of the cell capacitor is only the diffusion resistance in the first diffusion layer 206A. Specifically, the diffusion resistance is as low as about 5Ω. As a result, in the first DRAM section 102 where the cell capacitor formed in the first memory region $R_A$ is used as the capacitive element, high-speed processing can be realized because of the low resistance to the charge movement for signal processing. In contrast, the cell capacitor of the second memory region $R_B$ is formed on the contact plug 208, which is formed in the first interlayer insulating film 207, whereby there is a total resistance of the contact resistance between the contact plug 208 and the second diffusion layer 206B and the resistance of the contact plug 208 itself. Specifically, the total resistance is as high as about 10 kΩ. Therefore, the leak current, which occurs due to the charge stored in the cell capacitor formed in the second memory region $R_B$ leaking from the second diffusion layer 206B to the semiconductor substrate 200 via the contact plug 208, is reduced to be as small as 1 fA or less. Thus, in the second DRAM section 103 where the cell capacitor formed in the second memory region $R_B$ is used as the capacitive element, the charge stored in the cell capacitor is unlikely to leak, whereby it is possible to hold the signal stored therein sufficiently long and to reduce the amount of power that is used for recharging the cell capacitor.

Thus, it is possible to realize a DRAM-embedded device that realizes both a reduced power consumption and an increased processing speed while ensuring a sufficient signal holding characteristic, by optimizing the resistance occurring due to the connection between the cell capacitor and the semiconductor substrate 200 for each DRAM section according to the application thereof, as in the present embodiment.

Moreover, according to the second embodiment, the capacitor lower electrode of the cell capacitor formed in the first memory region $R_A$ is replaced with the diffusion layer 201 connected to the first diffusion layer 206A. Therefore, in the first memory region $R_A$, it is possible to save the distance over which a charge would otherwise have to be moved between the cell capacitor and the semiconductor substrate 200. Therefore, in the first DRAM section 102 where the cell capacitor formed in the first memory region $R_A$ is used as the capacitive element, the charge movement can be completed quickly, and thus a signal can be stored in the cell capacitor at a high speed, thereby realizing high-speed signal processing.

Note that while the inner surface and the outer surface of the second capacitor lower electrode 209, which is formed in a tubular shape in the second memory region $R_B$, are both used as a cell capacitor in the second embodiment, only the inner surface thereof may alternatively be used as a cell capacitor.

Moreover, while the cell capacitor of the second memory region $R_B$ has a tubular shape in the second embodiment, it may alternatively have a cylindrical shape or any other suitable shape.

Moreover, while the cell capacitor of the first memory region $R_A$ is a planar capacitor in the second embodiment, it may alternatively be a so-called "trench capacitor", which is formed in a hole provided in the semiconductor substrate 200.

Moreover, while an insulating film whose main component is silicon oxide is used as the insulating film 202 in the method for manufacturing the semiconductor device according to the second embodiment, any other suitable insulating film may alternatively be used.

Moreover, while a silicon film or a silicon/metal layered film is used as the electrode film 203 in the method for manufacturing the semiconductor device according to the second embodiment, any other suitable conductive film may alternatively be used.

Moreover, while phosphorus-containing silicon is used for the second capacitor lower electrode 209 and the second capacitor upper electrode 211 in the second memory region $R_B$ in the method for manufacturing the semiconductor device according to the second embodiment, silicon containing any other suitable impurity or any other suitable metal may alternatively be used.

Moreover, while an ON film is used as the second capacitor insulating film 210 in the second memory region $R_B$ in the method for manufacturing the semiconductor device according to the second embodiment, any other suitable capacitor insulating film may alternatively be used.

Third Embodiment

A semiconductor device according to the third embodiment and a method for manufacturing the same will now be described with reference to the drawings. Also in the present embodiment, the general configuration of the semiconductor device is as shown in the plan view of FIG. 1A.

Figure 5:
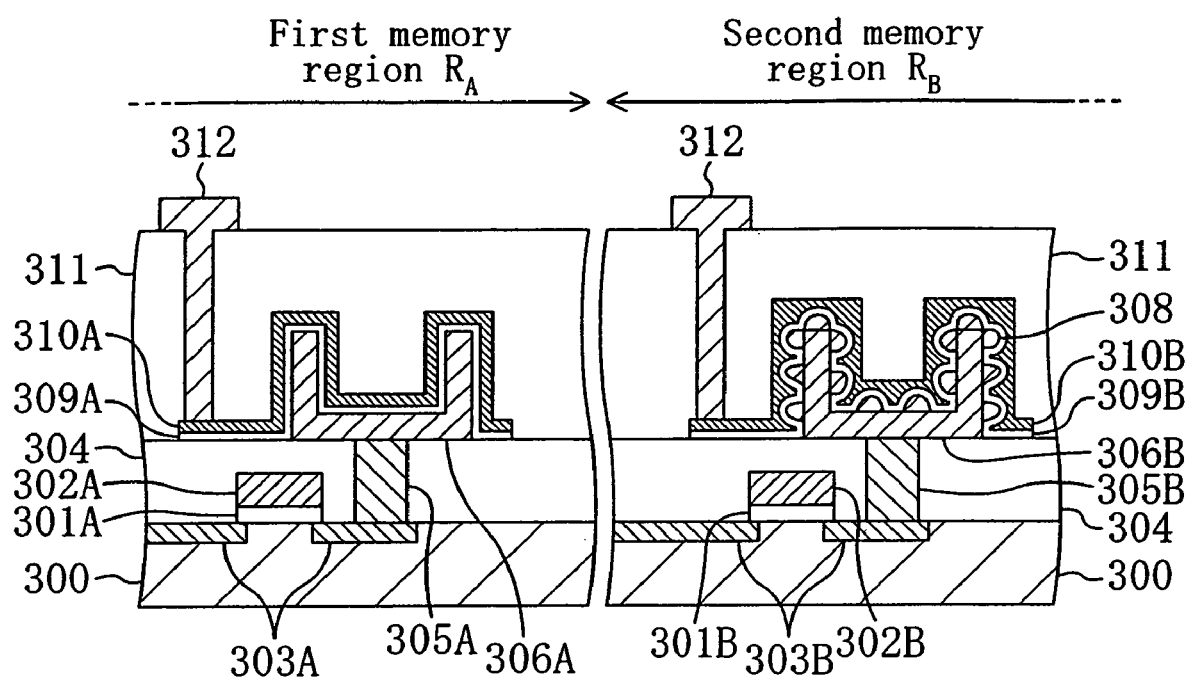
FIG. 5 is a cross-sectional view illustrating a semiconductor device according to the third embodiment of the present invention.

FIG. 5 is a cross-sectional view illustrating the semiconductor device according to the third embodiment. More specifically, FIG. 5 shows memory cells of the first DRAM section 102 and the second DRAM section 103 formed on the chip 100 illustrated in FIG. 1A. Note that the two regions where the first DRAM section 102 and the second DRAM section 103 are formed are referred to as "first memory region $R_A$" and "second memory region $R_B$", respectively.

As illustrated in FIG. 5, a first gate electrode 302A is formed on a semiconductor substrate 300 in the first memory region $R_A$ with a first gate insulating film 301A interposed between the semiconductor substrate 300 and the first gate electrode 302A. Thus, a transfer gate is formed in the first memory region $R_A$. A second gate electrode 302B is formed on the semiconductor substrate 300 in the second memory region $R_B$ with a second gate insulating film 301B interposed between the semiconductor substrate 300 and the second gate electrode 302B. Thus, a transfer gate is formed in the second memory region $R_B$. A first diffusion layer 303A is formed in the semiconductor substrate 300 beside the first gate electrode 302A. A second diffusion layer 303B is formed in the semiconductor substrate 300 beside the second gate electrode 302B. A first interlayer insulating film 304 is formed on the semiconductor substrate 300, the first gate electrode 302A and the second gate electrode 302B. A first contact plug 305A made of silicon, for example, which is connected to the first diffusion layer 303A, is formed in the first interlayer insulating film 304 in the first memory region $R_A$. A second contact plug 305B made of silicon, for example, which is connected to the second diffusion layer 303B, is formed in the first interlayer insulating film 304 in the second memory region $R_B$. A first capacitor lower electrode 306A made of silicon is formed on the first interlayer insulating film 304 in the first memory region $R_A$. The first capacitor lower electrode 306A has a tubular shape with a bottom surface and is connected to the first contact plug 305A. A second capacitor lower electrode 306B made of silicon is formed on the first interlayer insulating film 304 in the second memory region $R_B$. The second capacitor lower electrode 306B has a tubular shape with a bottom surface and is connected to the second contact plug 305B. The surface of the second capacitor lower electrode 306B in the second memory region $R_B$ is a roughened surface 308 having hemispherical grains. A first capacitor insulating film 309A, which is an ON film or a metal oxide film having a high dielectric constant, for example, is formed so as to cover the first capacitor lower electrode 306A, and a first capacitor upper electrode 310A made of silicon, for example, is formed so as to cover the first capacitor insulating film 309A. Thus, a cell capacitor of the first DRAM section 102 is formed in the first memory region $R_A$. A second capacitor insulating film 309B, which is an ON film or a metal oxide film having a high dielectric constant, for example, is formed so as to cover the second capacitor lower electrode 306B including the roughened surface 308, and a second capacitor upper electrode 310B made of silicon, for example, is formed so as to cover the second capacitor insulating film 309B. Thus, a cell capacitor of the second DRAM section 103 is formed in the second memory region $R_B$. A second interlayer insulating film 311 is formed on the first interlayer insulating film 304, the first capacitor upper electrode 310A and the second capacitor upper electrode 310B. A wiring layer 312 is formed on the second interlayer insulating film 311. The wiring layer 312 is formed so that portions thereof are connected to the first capacitor upper electrode 310A and the second capacitor upper electrode 310B.

A feature of the semiconductor device according to the third embodiment is that the surface of the second capacitor lower electrode 306B in the second memory region $R_B$ is the roughened surface 308. Therefore, the surface area of the second capacitor lower electrode 306B in the second memory region $R_B$ is larger than that of the first capacitor lower electrode 306A in the first memory region $R_A$. Thus, the capacitance of the cell capacitor formed in the second memory region $R_B$ is larger than that of the cell capacitor formed in the first memory region $R_A$. Specifically, where the surface of the second capacitor lower electrode 306B is formed into the roughened surface 308 by the HSG (hemi spherical grained) technique, the capacitance of the cell capacitor formed in the second memory region $R_B$ is about 20 fF, while the capacitance of the cell capacitor formed in the first memory region $R_A$ is about 10 fF.

Next, a method for manufacturing the semiconductor device according to the third embodiment will be described with reference to the drawings.

FIG. 6A to FIG. 6D are cross-sectional views illustrating steps in the method for manufacturing the semiconductor device according to the third embodiment. Note that in FIG. 6A to FIG. 6D, the same members as those of the semiconductor device of the third embodiment illustrated in FIG. 5 will be denoted by the same reference numerals.

As illustrated in FIG. 6A, the first gate electrode 302A is formed on the semiconductor substrate 300 in the first memory region $R_A$ with the first gate insulating film 301A interposed between the semiconductor substrate 300 and the first gate electrode 302A, and the second gate electrode 302B is formed on the semiconductor substrate 300 in the second memory region $R_B$ with the second gate insulating film 301B interposed between the semiconductor substrate 300 and the second gate electrode 302B. Thus, a transfer gate is formed in the first memory region $R_A$ and in the second memory region $R_B$. Then, the first diffusion layer 303A is formed in the semiconductor substrate 300 beside the first gate electrode 302A, and the second diffusion layer 303B is formed in the semiconductor substrate 300 beside the second gate electrode 302B. Then, the first interlayer insulating film 304 is formed across the entire surface of the semiconductor substrate 300. Then, the first contact plug 305A is formed in the first interlayer insulating film 304 in the first memory region $R_A$. The first contact plug 305A is made of silicon, for example, and is connected to the first diffusion layer 303A. At the same time, the second contact plug 305B is formed in the first interlayer insulating film 304 in the second memory region $R_B$. The second contact plug 305B is made of silicon, for example, and is connected to the second diffusion layer 303B. Then, the first capacitor lower electrode 306A is formed on the first interlayer insulating film 304 in the first memory region $R_A$. The first capacitor lower electrode 306A has a tubular shape with a bottom surface and is connected to the first contact plug 305A. At the same time, the second capacitor lower electrode 306B is formed on the first interlayer insulating film 304 in the second memory region $R_B$. The second capacitor lower electrode 306B has a tubular shape with a bottom surface and is connected to the second contact plug 305B. The first capacitor lower electrode 306A and the second capacitor lower electrode 306B are made of amorphous silicon, for example.

Then, as illustrated in FIG. 6B, a photoresist 307 is formed on the first interlayer insulating film 304 in the first memory region $R_A$ so as to completely mask the first capacitor lower electrode 306A. Then, the second capacitor lower electrode 306B in the second memory region $R_B$ is exposed to a chemical solution containing hydrofluoric acid, for example, so as to remove a silicon oxide film (not shown) formed through native oxidization covering the surface of the second capacitor lower electrode 306B.

Then, as illustrated in FIG. 6C, the surface of the second capacitor lower electrode 306B in the second memory region $R_B$ is formed into the roughened surface 308 having hemispherical grains by using, for example, the HSG technique, i.e., by subjecting the semiconductor substrate 300 to a heat treatment at a temperature near 620° C. in a silicon-containing gas atmosphere containing silane or disilane, for example. Then, the photoresist 307 formed in the first memory region $R_A$ is removed.

Then, as illustrated in FIG. 6D, an insulating film, which is an ON film or a metal oxide film having a high dielectric constant, for example, and an electrode film made of silicon, for example, are successively formed across the entire surface of the semiconductor substrate 300. Then, the insulating film and the electrode film are patterned, whereby the first capacitor insulating film 309A is formed so as to cover the first capacitor lower electrode 306A, and the first capacitor upper electrode 310A is formed so as to cover the first capacitor insulating film 309A. At the same time, the second capacitor insulating film 309B is formed so as to cover the second capacitor lower electrode 306B, and the second capacitor upper electrode 310B is formed so as to cover the second capacitor insulating film 309B. Thus, a cell capacitor of the first DRAM section 102 is formed in the first memory region $R_A$, and a cell capacitor of the second DRAM section 103 is formed in the second memory region $R_B$. Then, the second interlayer insulating film 311 is formed across the entire surface of the semiconductor substrate 300. Then, the wiring layer 312 is formed on the second interlayer insulating film 311. In this process, the wiring layer 312 is formed so that portions thereof are connected to the first capacitor upper electrode 310A and the second capacitor upper electrode 310B through contact holes formed in the second interlayer insulating film 311. Thus, the first DRAM section 102 and the second DRAM section 103 are formed in the first memory region $R_A$ and the second memory region $R_B$, respectively.

According to the third embodiment, the surface of the second capacitor lower electrode 306B in the second memory region $R_B$ is formed into the roughened surface 308, while the surface of the first capacitor lower electrode 306A in the first memory region $R_A$ is flat. Therefore, the surface area of the second capacitor lower electrode 306B in the second memory region $R_B$ is larger than that of the first capacitor lower electrode 306A in the first memory region $R_A$. Thus, the capacitance of the cell capacitor formed in the second memory region $R_B$ is larger than that of the cell capacitor formed in the first memory region $R_A$. Specifically, the capacitance of the cell capacitor formed in the first memory region $R_A$ can be set to 10 fF, while the capacitance of the cell capacitor formed in the second memory region $R_B$ can be set to 20 ff. In this way, where the operating voltage of the cell capacitors of the first memory region $R_A$ is equal to that of the second memory region $R_B$, the charge stored in the cell capacitor formed in the first memory region $R_A$ is about one half of that stored in the cell capacitor formed in the second memory region $R_B$. Therefore, in the first DRAM section 102 where the cell capacitor formed in the first memory region $R_A$ is used as the capacitive element, it is not necessary to move a large amount of charge for signal processing, and thus it is possible to reduce the power consumption and to quickly move the charge, thereby realizing high-speed processing. On the other hand, in the second DRAM section 103 where the cell capacitor formed in the second memory region $R_B$ is used as the capacitive element, a large amount of charge can be stored, thereby realizing a sufficient signal holding characteristic.

Thus, it is possible to realize a DRAM-embedded device that realizes both a reduced power consumption and an increased processing speed while ensuring a sufficient signal holding characteristic, by optimizing the capacitance of the cell capacitor for each DRAM section according to the application thereof, as in the present embodiment.

Moreover, effects as described above can reliably be obtained while employing the same structure and the same material for the cell capacitors of the first DRAM section 102 and for those of the second DRAM section 103.

Note that in the third embodiment, similar effects can be obtained when the capacitance of the cell capacitor formed in the first memory region $R_A$ is set to about 5 to 20 fF and the capacitance of the cell capacitor formed in the second memory region $R_B$ is set to 8 to 50 fF, while the capacitance of the cell capacitor formed in the first memory region $R_A$ is set to be smaller than that of the cell capacitor formed in the second memory region $R_B$.

Moreover, while silicon is used for each of the first contact plug 305A, the second contact plug 305B, the first capacitor upper electrode 310A and the second capacitor upper electrode 310B in the third embodiment, any other suitable metal may alternatively be used.

Moreover, an ON film or a metal oxide film having a high dielectric constant is used as the first capacitor insulating film 309A and the second capacitor insulating film 309B in the third embodiment, any other suitable capacitor insulating film may alternatively be used.

Moreover, while the inner surface and the outer surface of the first capacitor lower electrode 306A and the second capacitor lower electrode 306B, which are formed in a tubular shape in the first memory region $R_A$ and the second memory region $R_B$, respectively, are both used as a cell capacitor in the third embodiment, only the inner surface thereof may alternatively be used as a cell capacitor.

Moreover, while the inner surface and the outer surface of the second capacitor lower electrode 306B, which is formed in a tubular shape in the second memory region $R_B$, are both roughened in the third embodiment, only the inner surface thereof may alternatively be roughened.

Moreover, while the cell capacitor of the first memory region $R_A$ and that of the second memory region $R_B$ have a tubular shape in the third embodiment, they may alternatively have a cylindrical shape or any other suitable shape.

Moreover, while the cell capacitor of the first memory region $R_A$ and that of the second memory region $R_B$ are formed on the first interlayer insulating film 304 in the third embodiment, they may alternatively be formed in the first interlayer insulating film 304. In such a case, the inner surface of the tubular portion (the portion other than the bottom surface) of the first capacitor lower electrode 306A and the second capacitor lower electrode 306B may be used as a cell capacitor.

Moreover, while a silicon oxide film covering the surface of the second capacitor lower electrode 306B in the second memory region $R_B$ is removed by using hydrofluoric acid in the method for manufacturing the semiconductor device according to the third embodiment, the silicon oxide film may alternatively be removed by any other suitable method.

Moreover, in the method for manufacturing the semiconductor device according to the third embodiment, the second capacitor lower electrode 306B in the second memory region $R_B$ is formed in such an atmosphere that the surface of the second capacitor lower electrode 306B is covered with a native oxide film. Alternatively, the second capacitor lower electrode 306B may be formed in such an atmosphere that the surface of the second capacitor lower electrode 306B is not oxidized. In such a case, it is possible to eliminate the step of removing a silicon oxide film formed on the surface of the second capacitor lower electrode 306B.

Moreover, while a silicon-containing gas containing silane or disilane is used as the silicon-containing gas for roughening the surface of the second capacitor lower electrode 306B in the second memory region $R_B$ in the method for manufacturing the semiconductor device according to the third embodiment, any other suitable silicon-containing gas may alternatively be used.

Moreover, the surface of the second capacitor lower electrode 306B in the second memory region $R_B$ is roughened by performing a heat treatment at a temperature near 620° C. in a silicon-containing gas atmosphere in the method for manufacturing the semiconductor device according to the third embodiment, any other suitable method may be used for roughening the second capacitor lower electrode 306B.

Fourth Embodiment

A semiconductor device according to the fourth embodiment and a method for manufacturing the same will now be described with reference to the drawings. Also in the present embodiment, the general configuration of the semiconductor device is as shown in the plan view of FIG. 1A.

Figure 7:
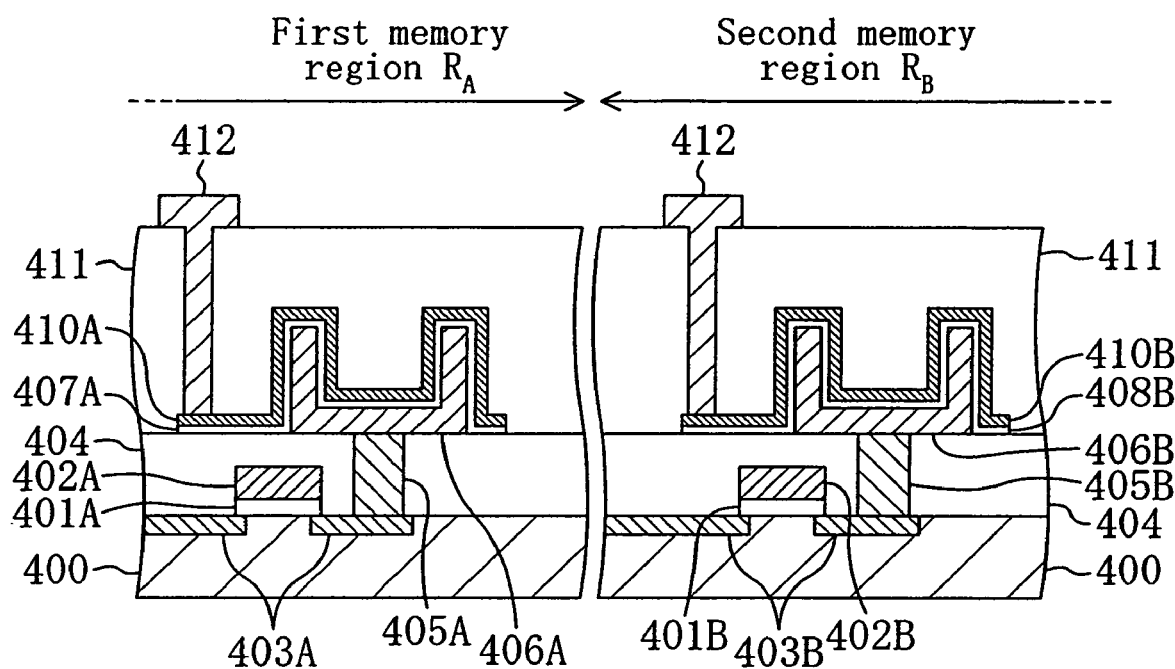
FIG. 7 is a cross-sectional view illustrating a semiconductor device according to the fourth embodiment of the present invention.

FIG. 7 is a cross-sectional view illustrating the semiconductor device according to the fourth embodiment. More specifically, FIG. 7 shows memory cells of the first DRAM section 102 and the second DRAM section 103 formed on the chip 100 illustrated in FIG. 1A. Note that the two regions where the first DRAM section 102 and the second DRAM section 103 are formed are referred to as "first memory region $R_A$" and "second memory region $R_B$", respectively.

As illustrated in FIG. 7, a first gate electrode 402A is formed on a semiconductor substrate 400 in the first memory region $R_A$ with a first gate insulating film 401A interposed between the semiconductor substrate 400 and the first gate electrode 402A. Thus, a transfer gate is formed in the first memory region $R_A$. The second gate electrode 402B is formed on the semiconductor substrate 400 in the second memory region $R_B$ with the second gate insulating film 401B interposed between the semiconductor substrate 400 and the second gate electrode 402B. Thus, a transfer gate is formed in the second memory region $R_B$. A first diffusion layer 403A is formed in the semiconductor substrate 400 beside the first gate electrode 402A. A second diffusion layer 403B is formed in the semiconductor substrate 400 beside the second gate electrode 402B. A first interlayer insulating film 404 is formed on the semiconductor substrate 400, the first gate electrode 402A and the second gate electrode 402B. A first contact plug 405A connected to the first diffusion layer 403A is formed in the first interlayer insulating film 404 in the first memory region $R_A$. A second contact plug 405B connected to the second diffusion layer 403B is formed in the first interlayer insulating film 404 in the second memory region $R_B$. A first capacitor lower electrode 406A is formed on the first interlayer insulating film 404 in the first memory region $R_A$. The first capacitor lower electrode 406A has a tubular shape with a bottom surface and is connected to the first contact plug 405A. A second capacitor lower electrode 406B is formed on the first interlayer insulating film 404 in the second memory region $R_B$. The second capacitor lower electrode 406B has a tubular shape with a bottom surface and is connected to the second contact plug 405B. A first low-dielectric-constant film 407A, which is an ON film, for example, is formed so as to cover the first capacitor lower electrode 406A, and a first capacitor upper electrode 410A is formed so as to cover the first low-dielectric-constant film 407A. Thus, a cell capacitor of the first DRAM section 102 is formed in the first memory region $R_A$. A second high-dielectric-constant film 408B, which is a tantalum oxide ($Ta_2O_5$) film having a high dielectric constant, for example, is formed so as to cover the second capacitor lower electrode 406B, and a second capacitor upper electrode 410B is formed so as to cover the second high-dielectric-constant film 408B. Thus, a cell capacitor of the second DRAM section 103 is formed in the second memory region $R_B$. A second interlayer insulating film 411 is formed on the first interlayer insulating film 404, the first capacitor upper electrode 410A and the second capacitor upper electrode 410B. A wiring layer 412 is formed on the second interlayer insulating film 411. The wiring layer 412 is formed so that portions thereof are connected to the first capacitor upper electrode 410A and the second capacitor upper electrode 410B through contact holes formed in the second interlayer insulating film 411. Note that the terms "low-dielectric-constant film" and "high-dielectric-constant film" are used in the present embodiment to indicate that these films have different dielectric constants.

A feature of the semiconductor device according to the fourth embodiment is that the material of the first low-dielectric-constant film 407A in the first memory region $R_A$ is different from that of the second high-dielectric-constant film 408B in the second memory region $R_B$. Consider a case where the relative dielectric constant and the equivalent oxide thickness of the ON film used as the first low-dielectric-constant film 407A in the first memory region $R_A$ are set to 3.9 and 4.7 nm, respectively, and the relative dielectric constant and the equivalent oxide thickness of the $Ta_2O_5$ film used as the second high-dielectric-constant film 408B in the second memory region $R_B$ are set to 20 and 3.2 nm, respectively. In such a case, if the capacitance of the cell capacitor formed in the first memory region $R_A$ is 10 fF, the capacitance of the cell capacitor formed in the second memory region $R_B$ is 14.7 fF based on Expression (4) below.

$$10 \text{ fF} \cdot 4.7 \text{ nm}/3.2 \text{ nm} = 14.7 \text{ fF} \quad (4)$$

Therefore, according to the present embodiment, the capacitance of the cell capacitor formed in the first memory region $R_A$ can be set to be smaller than that of the cell capacitor formed in the second memory region $R_B$.

Next, a method for manufacturing the semiconductor device according to the fourth embodiment will be described with reference to the drawings.

FIG. 8A to FIG. 8D are cross-sectional views illustrating steps in the method for manufacturing the semiconductor device according to the fourth embodiment. Note that in FIG. 8A to FIG. 8D, the same members as those of the semiconductor device of the fourth embodiment illustrated in FIG. 7 will be denoted by the same reference numerals.

Figure 8A:
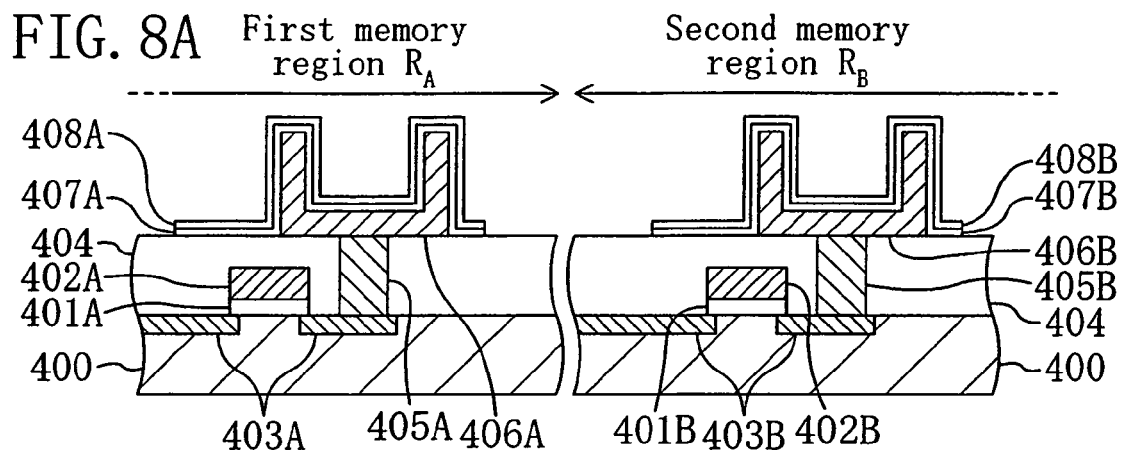
FIG. 8A to FIG. 8D are cross-sectional views illustrating steps in a method for manufacturing the semiconductor device according to the fourth embodiment of the present invention.

As illustrated in FIG. 8A, the first gate electrode 402A is formed on the semiconductor substrate 400 in the first memory region $R_A$ with the first gate insulating film 401A interposed between the semiconductor substrate 400 and the first gate electrode 402A, and the second gate electrode 402B is formed on the semiconductor substrate 400 in the second memory region $R_B$ with the second gate insulating film 401B interposed between the semiconductor substrate 400 and the second gate electrode 402B. Thus, a transfer gate is formed in the first memory region $R_A$ and in the second memory region $R_B$. Then, the first diffusion layer 403A is formed in the semiconductor substrate 400 beside the first gate electrode 402A, and the second diffusion layer 403B is formed in the semiconductor substrate 400 beside the second gate electrode 402B. Then, the first interlayer insulating film 404 is formed across the entire surface of the semiconductor substrate 400. Then, the first contact plug 405A connected to the first diffusion layer 403A is formed in the first interlayer insulating film 404 in the first memory region $R_A$, and the second contact plug 405B connected to the second diffusion layer 403B is formed in the first interlayer insulating film 404 in the second memory region $R_B$. Then, the first capacitor lower electrode 406A is formed on the first interlayer insulating film 404 in the first memory region $R_A$, and the second capacitor lower electrode 406B is formed on the first interlayer insulating film 404 in the second memory region $R_B$. The first capacitor lower electrode 406A has a tubular shape with a bottom surface and is connected to the first contact plug 405A, and the second capacitor lower electrode 406B has a tubular shape with a bottom surface and is connected to the second contact plug 405B. Then, a low-dielectric-constant film, which is a silicon nitride film, for example, and a high-dielectric-constant film, which is a $Ta_2O_5$ film, for example, are formed across the entire surface of the semiconductor substrate 400. Then, the low-dielectric-constant film and the high-dielectric-constant film are patterned, whereby the first low-dielectric-constant film 407A is formed so as to cover the first capacitor lower electrode 406A, and a first high-dielectric-constant film 408A is formed so as to cover the first low-dielectric-constant film 407A. At the same time, a second low-dielectric-constant film 407B is formed so as to cover the second capacitor lower electrode 406B, and the second high-dielectric-constant film 408B is formed so as to cover the second low-dielectric-constant film 407B.

Figure 8B:
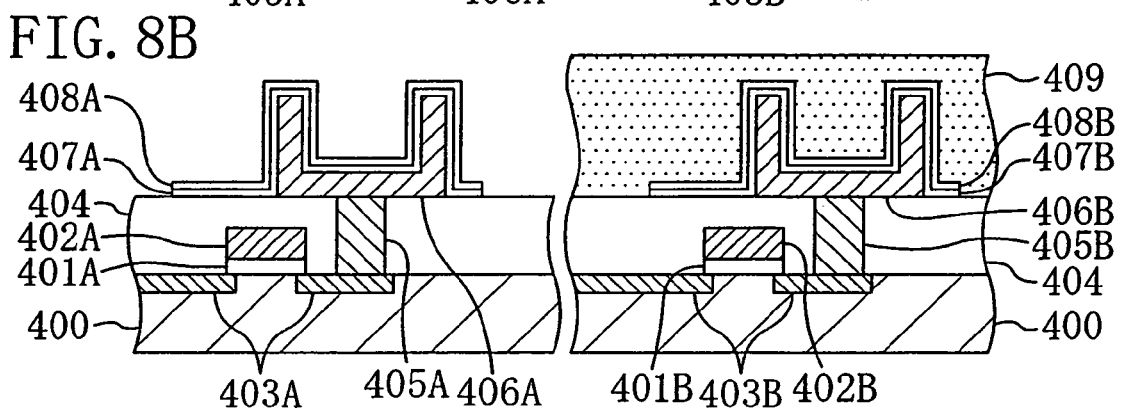

Then, as illustrated in FIG. 8B, a resist mask 409 is formed on the second high-dielectric-constant film 408B in the second memory region $R_B$ so as to completely mask the second high-dielectric-constant film 408B.

Figure 8C:
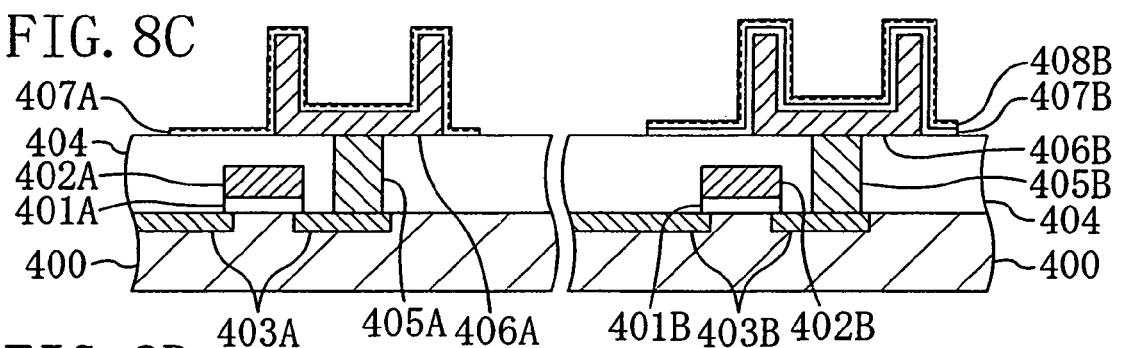

Then, as illustrated in FIG. 8C, the first high-dielectric-constant film 408A in the first memory region $R_A$ is selectively removed by wet etching by using a chemical solution containing hydrofluoric acid, for example. Then, the semiconductor substrate 400 is subjected to a heat treatment in an oxygen-containing atmosphere, for example, whereby the first low-dielectric-constant film 407A in the first memory region $R_A$ is oxidized into a layered film of a silicon nitride film and a silicon oxide film (ON film), and the second high-dielectric-constant film 408B in the second memory region $R_B$ is crystallized while adding oxygen to the second high-dielectric-constant film 408B.

Figure 8D:
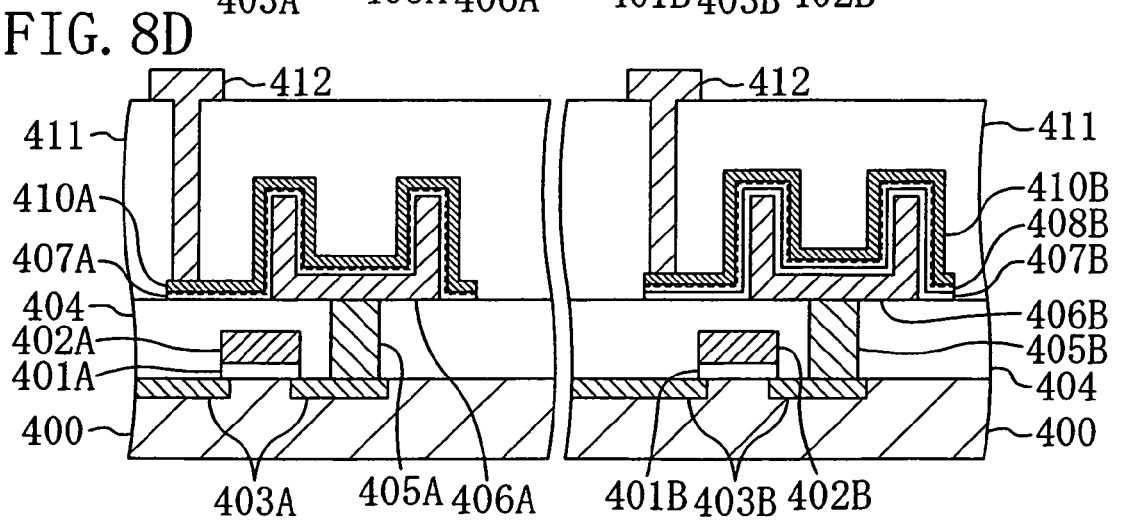

Then, as illustrated in FIG. 8D, a metal film is formed across the entire surface of the semiconductor substrate 400. Then, the metal film is patterned by photolithography and dry etching, whereby the first capacitor upper electrode 410A is formed so as to cover the first low-dielectric-constant film 407A, and the second capacitor upper electrode 410B is formed so as to cover the second high-dielectric-constant film 408B. Thus, a cell capacitor of the first DRAM section 102 is formed in the first memory region $R_A$, and a cell capacitor of the second DRAM section 103 is formed in the second memory region $R_B$. Then, the second interlayer insulating film 411 is formed across the entire surface of the semiconductor substrate 400. Then, the wiring layer 412 is formed on the second interlayer insulating film 411. In this process, the wiring layer 412 is formed so that portions thereof are connected to the first capacitor upper electrode 410A and the second capacitor upper electrode 410B through contact holes formed in the second interlayer insulating film 411. Thus, the first DRAM section 102 and the second DRAM section 103 are formed in the first memory region $R_A$ and the second memory region $R_B$, respectively.

According to the fourth embodiment, the capacitor insulating film of the cell capacitor formed in the first memory region $R_A$ is an ON film. On the other hand, the capacitor insulating film of the cell capacitor formed in the second memory region $R_B$ is formed from a silicon nitride film and a $Ta_2O_5$ film having a high dielectric constant (note however that in the semiconductor device of the present embodiment, the capacitor insulating film of the cell capacitor formed in the second memory region $R_B$ is formed only from a $Ta_2O_5$ film). Therefore, the capacitance of the cell capacitor of the first memory region $R_A$ is smaller than that of the cell capacitor of the second memory region $R_B$. Specifically, when the ON film of the first low-dielectric-constant film 407A has a relative dielectric constant of 5 while the $Ta_2O_5$ film of the second high-dielectric-constant film 408B has a relative dielectric constant of 10, the capacitance of the cell capacitor formed in the first memory region $R_A$ can be set to 10 fF, for example, while the capacitance of the cell capacitor formed in the second memory region $R_B$ can be set to 20 fF, for example. Therefore, the capacitance of the cell capacitor formed in the first memory region $R_A$ is about one half of that of the cell capacitor formed in the second memory region $R_B$. Thus, where the voltage applied across the cell capacitor formed in the first memory region $R_A$ is equal to that applied across the cell capacitor formed in the second memory region $R_B$, the charge stored in the cell capacitor formed in the first memory region $R_A$ is about one half of that stored in the cell capacitor formed in the second memory region $R_B$. Therefore, in the first DRAM section 102 where the cell capacitor formed in the first memory region $R_A$ is used as the capacitive element, it is not necessary to move a large amount of charge for signal processing, and thus it is possible to reduce the power consumption and to quickly move the charge, thereby realizing high-speed processing. On the other hand, in the second DRAM section 103 where the cell capacitor formed in the second memory region $R_B$ is used as the capacitive element, a large amount of charge can be stored, thereby realizing a sufficient signal holding characteristic.

Thus, it is possible to realize a DRAM-embedded device that realizes both a reduced power consumption and an increased processing speed while ensuring a sufficient signal holding characteristic, by optimizing the capacitance of the cell capacitor for each DRAM section according to the application thereof, as in the present embodiment.

Note that while an ON film is used for the first low-dielectric-constant film 407A, a silicon nitride film for the second low-dielectric-constant film 407B, and a $Ta_2O_5$ film for the second high-dielectric-constant film 408B in the fourth embodiment, any other suitable capacitor insulating films may alternatively be used. Specifically, a film having a high dielectric constant, such as an aluminum oxide film or a BST (barium strontium titanate oxide) film, for example, is preferably used as the second high-dielectric-constant film 408B. Note however that the capacitance of the cell capacitor formed in the first memory region $R_A$ needs to be smaller than that of the cell capacitor formed in the second memory region $R_B$.

Moreover, while the inner surface and the outer surface of the first capacitor lower electrode 406A and the second capacitor lower electrode 406B, which are formed in a tubular shape in the first memory region $R_A$ and the second memory region $R_B$, respectively, are both used as a cell capacitor in the fourth embodiment, only the inner surface thereof may alternatively be used as a cell capacitor.

Moreover, while the cell capacitor of the first memory region $R_A$ and that of the second memory region $R_B$ have a tubular shape in the fourth embodiment, they may alternatively have a cylindrical shape or any other suitable shape.

Moreover, while a stacked capacitor having a tubular shape with a bottom surface is used as the cell capacitor of the first memory region $R_A$ and that of the second memory region $R_B$ in the fourth embodiment, a simple stacked capacitor may alternatively be used.

Moreover, while the cell capacitor of the first memory region $R_A$ and that of the second memory region $R_B$ are formed on the first interlayer insulating film 404 in the fourth embodiment, they may alternatively be formed in the first interlayer insulating film 404. In such a case, the inner surface of the tubular portion (the portion other than the bottom surface) of the first capacitor lower electrode 406A and the second capacitor lower electrode 406B may be used as a cell capacitor.

Moreover, in the method for manufacturing the semiconductor device according to the fourth embodiment, the capacitor insulating film of the cell capacitor of the second DRAM section 103 is formed from the second low-dielectric-constant film 407B and the second high-dielectric-constant film 408B. Alternatively, the capacitor insulating film of the cell capacitor of the second DRAM section 103 may be formed only from the second high-dielectric-constant film 408B. In such a case, the first low-dielectric-constant film 407A and the second high-dielectric-constant film 408B may be formed separately in the first memory region $R_A$ and in the second memory region $R_B$, respectively.

Fifth Embodiment

A semiconductor device according to the fifth embodiment and a method for manufacturing the same will now be described with reference to the drawings. Also in the present embodiment, the general configuration of the semiconductor device is as shown in the plan view of FIG. 1A.

Figure 9:
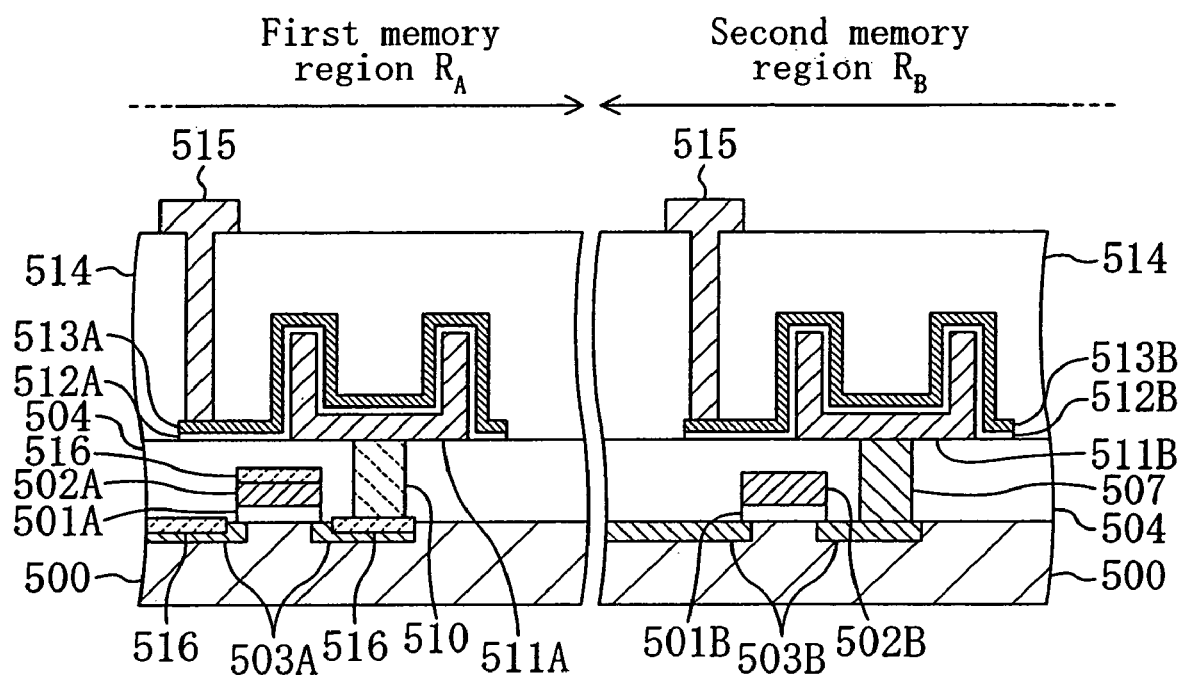
FIG. 9 is a cross-sectional view illustrating a semiconductor device according to the fifth embodiment of the present invention.
Figure 12A:
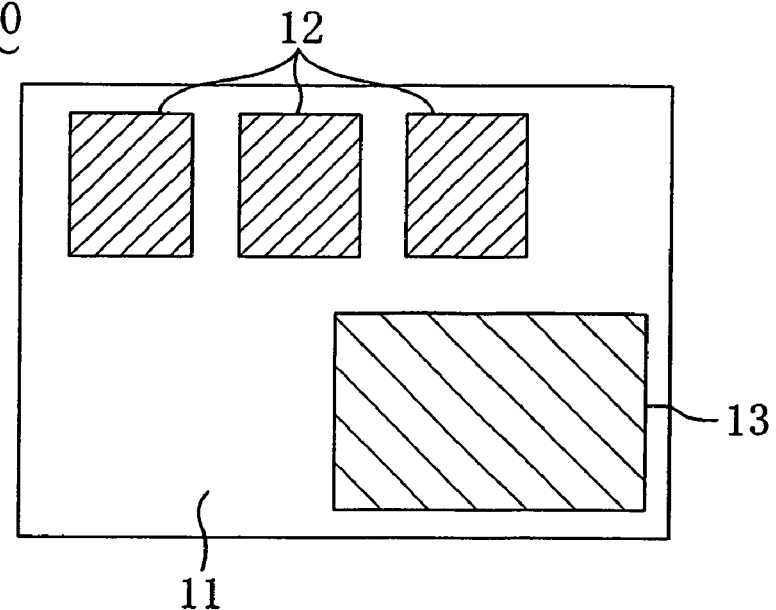
FIG. 12A is a plan view illustrating a general configuration of a conventional DRAM-embedded system LSI chip.
Figure 12B:
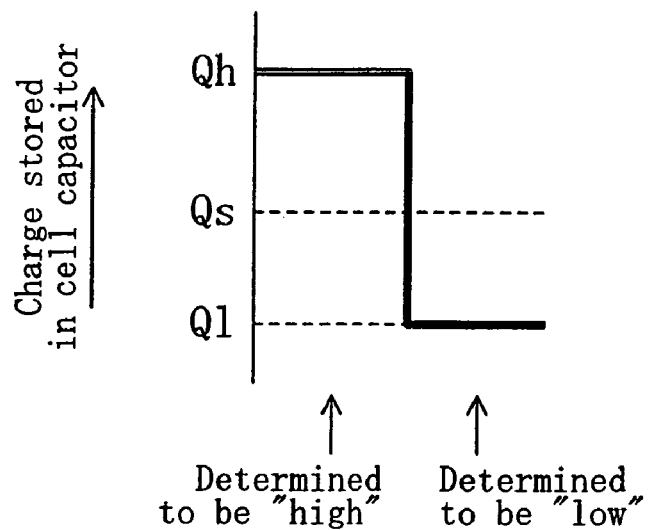
FIG. 12B is a graph illustrating the relationship between the reference charge and the charge stored in a cell capacitor of a first DRAM section and a second DRAM section illustrated in FIG. 12A.
Figure 12C:
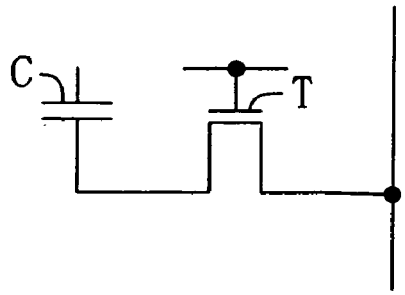
FIG. 12C is an equivalent circuit diagram illustrating a memory cell of the second DRAM section illustrated in FIG. 12A.

FIG. 9 is a cross-sectional view illustrating the semiconductor device according to the fifth embodiment. More specifically, FIG. 9 shows memory cells of the first DRAM section 102 and the fifth DRAM section 103 formed on the chip 100 illustrated in FIG. 1A. Note that the two regions where the first DRAM section 102 and the second DRAM section 103 are formed are referred to as "first memory region $R_A$" and "second memory region $R_B$", respectively.

As illustrated in FIG. 9, a first gate electrode 502A is formed on a semiconductor substrate 500 made of silicon, for example, in the first memory region $R_A$ with a first gate insulating film 501A interposed between the semiconductor substrate 500 and the first gate electrode 502A. Thus, a transfer gate is formed in the first memory region $R_A$. A second gate electrode 502B is formed on the semiconductor substrate 500 in the second memory region $R_B$ with a second gate insulating film 501B interposed between the semiconductor substrate 500 and the second gate electrode 502B. Thus, a transfer gate is formed in the second memory region $R_B$. A first diffusion layer 503A is formed in the semiconductor substrate 500 beside the first gate electrode 502A. Moreover, a silicide layer 516 is formed on the first gate electrode 502A and the first diffusion layer 503A. A second diffusion layer 503B is formed in the semiconductor substrate 500 beside the second gate electrode 502B. A first interlayer insulating film 504 is formed on the semiconductor substrate 500, the first gate electrode 502A and the second gate electrode 502B. A first contact plug 510 made of tungsten, for example, which is connected to the first diffusion layer 503A, is formed in the first interlayer insulating film 504 in the first memory region $R_A$. A second contact plug 507 made of silicon, for example, which is connected to the second diffusion layer 503B, is formed in the first interlayer insulating film 504 in the second memory region $R_B$. A first capacitor lower electrode 511A is formed on the first interlayer insulating film 504 in the first memory region $R_A$. The first capacitor lower electrode 511A has a tubular shape with a bottom surface and is connected to the first contact plug 510. A second capacitor lower electrode 511B is formed on the first interlayer insulating film 504 in the second memory region $R_B$. The second capacitor lower electrode 511B has a tubular shape with a bottom surface and is connected to the second contact plug 507. A first capacitor insulating film 512A is formed so as to cover the first capacitor lower electrode 511A, and a first capacitor upper electrode 513A is formed so as to cover the first capacitor insulating film 512A. Thus, a cell capacitor of the first DRAM section 102 is formed in the first memory region $R_A$. A second capacitor insulating film 512B is formed so as to cover the second capacitor lower electrode 511B, and a second capacitor upper electrode 513B is formed so as to cover the second capacitor insulating film 512B. Thus, a cell capacitor of the second DRAM section 103 is formed in the second memory region $R_B$. A second interlayer insulating film 514 is formed on the first interlayer insulating film 504, the first capacitor upper electrode 513A and the second capacitor upper electrode 513B. A wiring layer 515 is formed on the second interlayer insulating film 514. The wiring layer 515 is formed so that portions thereof are connected to the first capacitor upper electrode 513A and the second capacitor upper electrode 513B through contact holes formed in the second interlayer insulating film 514.

A feature of the semiconductor device according to the fifth embodiment is that the material of the first contact plug 510 connected to the first diffusion layer 503A in the first memory region $R_A$ is different from that of the second contact plug 507 connected to the second diffusion layer 503B in the second memory region $R_B$. Specifically, the material of the first contact plug 510 is tungsten, while the material of the second contact plug 507 is silicon.

Next, a method for manufacturing the semiconductor device according to the fifth embodiment will be described with reference to the drawings.

FIG. 10A to FIG. 10E, FIG. 11A and FIG. 11B are cross-sectional views illustrating steps in the method for manufacturing the semiconductor device according to the fifth embodiment. Note that in FIG. 10A to FIG. 10E, FIG. 11A and FIG. 11B, the same members as those of the semiconductor device of the fifth embodiment illustrated in FIG. 9 will be denoted by the same reference numerals.

As illustrated in FIG. 10A, the first gate electrode 502A is formed on the semiconductor substrate 500 made of silicon, for example, in the first memory region $R_A$ with the first gate insulating film 501A interposed between the semiconductor substrate 500 and the first gate electrode 502A, and the second gate electrode 502B is formed on the semiconductor substrate 500 in the second memory region $R_B$ with the second gate insulating film 501B interposed between the semiconductor substrate 500 and the second gate electrode 502B. Thus, a transfer gate is formed in the first memory region $R_A$ and in the second memory region $R_B$. Then, the first diffusion layer 503A is formed in the semiconductor substrate 500 beside the first gate electrode 502A, and the second diffusion layer 503B is formed in the semiconductor substrate 500 beside the second gate electrode 502B. (Note that the silicide layer 516 can then be formed selectively on the first diffusion layer 503A and the first gate electrode 502A by using a salicide technique in order to manufacture the semiconductor device according to the fifth embodiment as described above.) Then, the first interlayer insulating film 504, which is a silicon oxide film containing boron or phosphorus as an impurity, for example, is formed across the entire surface of the semiconductor substrate 500. Then, a second contact hole 505 reaching the second diffusion layer 503B is formed by photolithography and etching in the first interlayer insulating film 504 in the second memory region $R_B$.

Then, as illustrated in FIG. 10B, a silicon film 506 made of phosphorus-containing silicon, for example, is formed across the entire surface of the semiconductor substrate 500 so as to completely bury the second contact hole 505.

Then, as illustrated in FIG. 10C, an unnecessary portion of the silicon film 506 on the first interlayer insulating film 504 is removed by chemical-mechanical polishing, for example, thereby forming the second contact plug 507 in the second contact hole 505.

Then, as illustrated in FIG. 10D, a first contact hole 508 reaching the first diffusion layer 503A is formed by photolithography and etching in the first interlayer insulating film 504 in the first memory region $R_A$.

Then, as illustrated in FIG. 10E, a metal film 509 made of tungsten, for example, is formed across the entire surface of the semiconductor substrate 500 so as to completely bury the first contact hole 508.

Then, as illustrated in FIG. 11A, an unnecessary portion of the metal film 509 on the first interlayer insulating film 504 is removed by chemical-mechanical polishing, for example, thereby forming the first contact plug 510 in the first contact hole 508.

Then, as illustrated in FIG. 11B, the first capacitor lower electrode 511A is formed on the first interlayer insulating film 504 in the first memory region $R_A$. The first capacitor lower electrode 511A has a tubular shape with a bottom surface and is connected to the first contact plug 510. At the same time, the second capacitor lower electrode 511B is formed on the first interlayer insulating film 504 in the second memory region $R_B$. The second capacitor lower electrode 511B has a tubular shape with a bottom surface and is connected to the second contact plug 507. Then, the first capacitor insulating film 512A is formed so as to cover the first capacitor lower electrode 511A, and the first capacitor upper electrode 513A is formed so as to cover the first capacitor insulating film 512A. At the same time, the second capacitor insulating film 512B is formed so as to cover the second capacitor lower electrode 511B, and the second capacitor upper electrode 513B is formed so as to cover the second capacitor insulating film 512B. Thus, a cell capacitor of the first DRAM section 102 is formed in the first memory region $R_A$, and a cell capacitor of the second DRAM section 103 is formed in the second memory region $R_B$. Then, the second interlayer insulating film 514 is formed across the entire surface of the semiconductor substrate 500. Then, the wiring layer 515 is formed on the second interlayer insulating film 514. In this process, the wiring layer 515 is formed so that portions thereof are connected to the first capacitor upper electrode 513A and the second capacitor upper electrode 513B. Thus, the first DRAM section 102 and the second DRAM section 103 are formed in the first memory region $R_A$ and the second memory region $R_B$, respectively.

According to the fifth embodiment, the first contact plug 510 in the first memory region $R_A$ is made of tungsten, whereas the second contact plug 507 in the second memory region $R_B$ is made of phosphorus-containing silicon. Therefore, in the first memory region $R_A$, the contact resistance between the first contact plug 510 and the first diffusion layer 503A is low, since the contact is a tungsten-silicon contact. In addition, since the resistance of tungsten is low, whereby even the total of these resistances combined together is as low as on the order of $\Omega$. As a result, in the first DRAM section 102 formed in the first memory region $R_A$ using the first contact plug 510, the resistance to the charge movement for signal processing is low, thereby realizing high-speed processing. In contrast, in the second memory region $R_B$, the contact resistance between the second contact plug 507 and the second diffusion layer 503B is relatively high since the contact is a silicon-silicon contact. In addition, the resistance of silicon is also relatively high, whereby the total of these resistances combined together is as high as on the order of 10 k $\Omega$. Therefore, the leak current, i.e., the charge stored in the cell capacitor formed in the second memory region $R_B$ leaking from the second diffusion layer 503B to the semiconductor substrate 500 via the second contact plug 507, is reduced. Thus, in the second DRAM section 103 formed in the second memory region $R_B$ using the second contact plug 507, the charge stored in the cell capacitor is unlikely to leak, whereby it is possible to hold the signal stored therein sufficiently long and to reduce the amount of power that is used for recharging the cell capacitor.

Thus, it is possible to realize a DRAM-embedded device that realizes both a reduced power consumption and an increased processing speed while ensuring a sufficient signal holding characteristic, by optimizing the resistance, which occurs due to the connection between a cell capacitor and the semiconductor substrate via a plug, for each DRAM section according to the application thereof, as in the present embodiment.

Furthermore, in the semiconductor device according to the present embodiment, the silicide layer 516 is formed in the first diffusion layer 503A connected to the first contact plug 510, whereby it is possible to reduce the contact resistance between the first diffusion layer 503A and the first contact plug 510. Thus, effects as described above can reliably be obtained.

Note that while tungsten is used as the material of the first contact plug 510 in the fifth embodiment, any other suitable low-resistance metal may alternatively be used.

Moreover, while a silicon substrate is used as the semiconductor substrate 500 in the fifth embodiment, any other suitable semiconductor substrate may alternatively be used. In such a case, the material of the contact plug needs to be selected in view of the contact resistance between the diffusion layer formed in the semiconductor substrate and the contact plug and the resistance of the contact plug itself.

Moreover, while the inner surface and the outer surface of the first capacitor lower electrode 511A and the second capacitor lower electrode 511B, which are formed in a tubular shape in the first memory region $R_A$ and the second memory region $R_B$, respectively, are both used as a cell capacitor in the fifth embodiment, only the inner surface thereof may alternatively be used as a cell capacitor.

Moreover, while the cell capacitor of the first memory region $R_A$ and that of the second memory region $R_B$ have a tubular shape in the fifth embodiment, they may alternatively have a cylindrical shape or any other suitable shape.

Moreover, in the fifth embodiment, a barrier metal made of TiN or Ti, for example, may be formed on the surface of the first contact hole 508, between the step of forming the metal film 509 and the step of forming the first contact hole 508.

What is claimed is:

1. A semiconductor device, comprising a first DRAM section including a first memory cell having a first capacitance and a second DRAM section including a second memory cell having a second capacitance different from the first capacitance, the first DRAM section and the second DRAM section being provided on the same semiconductor substrate,
   wherein a surface of a capacitor lower electrode of the first memory cell is not roughened, whereas a surface of a capacitor lower electrode of the second memory cell is roughened.

2. The semiconductor device of claim 1, wherein an operating voltage of the first DRAM section is higher than that of the second DRAM section.

3. The semiconductor device of claim 1, wherein the capacitor lower electrode of the first memory cell is provided in the semiconductor substrate, whereas neither of a capacitor upper electrode and the capacitor lower electrode of the second memory cell is provided in the semiconductor substrate.

4. The semiconductor device of claim 1, wherein the capacitor lower electrode of the first memory cell is made of silicon and the capacitor lower electrode of the second memory cell is made of silicon.

5. The semiconductor device of claim 1, wherein different materials are used for a capacitor insulating film of the first memory cell and for a capacitor insulating film of the second memory cell.

6. The semiconductor device of claim 1, wherein
   the semiconductor substrate and the first memory cell are connected to each other by a first plug, and the semiconductor substrate and the second memory cell are connected to each other by a second plug; and
   different materials are used for the first plug and for the second plug.

7. The semiconductor device of claim 6, wherein a contact resistance between the first plug and the semiconductor substrate is different from that between the second plug and the semiconductor substrate.

* * * * *